United States Patent
Kursun et al.

(10) Patent No.: US 7,764,087 B2
(45) Date of Patent: Jul. 27, 2010

(54) LOW SWING DOMINO LOGIC CIRCUITS

(75) Inventors: Volkan Kursun, Fitchburg, WI (US); Zhiyu Liu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/701,194

(22) Filed: Jan. 31, 2007

(65) Prior Publication Data
US 2007/0176641 A1     Aug. 2, 2007

Related U.S. Application Data

(60) Provisional application No. 60/764,741, filed on Feb. 1, 2006.

(51) Int. Cl.
*H03K 19/096* (2006.01)

(52) U.S. Cl. .............................. 326/95; 326/98; 326/121

(58) Field of Classification Search ............. 326/81–83, 326/86–87, 93, 95–98, 105, 119, 121, 68
See application file for complete search history.

(56) References Cited

U.S. PATENT DOCUMENTS

| | | | | |
|---|---|---|---|---|
| 5,490,119 A | * | 2/1996 | Sakurai et al. ......... | 365/230.08 |
| 5,990,706 A | * | 11/1999 | Matsumoto et al. ........... | 326/98 |
| 6,600,340 B2 | * | 7/2003 | Krishnamurthy et al. ...... | 326/98 |
| 6,646,473 B1 | * | 11/2003 | Trivedi et al. ................. | 326/96 |
| 6,693,461 B2 | * | 2/2004 | Hsu et al. ...................... | 326/95 |
| 6,842,046 B2 | * | 1/2005 | Tzartzanis et al. ............ | 326/98 |
| 6,900,666 B2 | * | 5/2005 | Kursun et al. ................ | 326/95 |

OTHER PUBLICATIONS

A. Rjoub et al., "Low-Power/Low-Swing Domino Cmos Logic," 1998 IEEE; pp. II-13-II-16.
V. Kursun et al., "Low Swing Dual Threshold Voltage Domino Logic," ACM/SIGDA Great Lakes Symposium on VLSI; Apr. 2002; pp. 47-52.
Z.Liu et al., "Bidirectional Dynamic Node Low Voltage Swing Domino Logic," 2005 IEEE; pp. 295-298.
R. Mader et al., "Reduced Dynamic Swing Domino Logic," GLSVLSI 2003; Washington, DC., Apr. 28-29, 2003; pp. 33-36.

* cited by examiner

*Primary Examiner*—James H. Cho
*Assistant Examiner*—Christopher Lo
(74) *Attorney, Agent, or Firm*—Boyle Fredrickson, S.C.

(57) ABSTRACT

Low voltage swing techniques are provided for simultaneously reducing the active and standby mode power consumption and enhancing the noise immunity in domino logic circuits. One or both the upper and lower boundaries of the voltage swing at the dynamic node may be different from the upper and lower boundaries of the voltage swing at the output node. Further, the domino logic circuit may use dual $V_t$ thereby reducing the short-circuit current during operation. Meanwhile, full voltage swing signals may be maintained at the inputs and outputs for high speed operation. The low swing circuit techniques are provided that modify the output voltage swing of a domino gate, thereby reducing the active mode power consumption.

14 Claims, 34 Drawing Sheets

Low Swing Buffer

LOW SWING DOMINO LOGIC CIRCUITS

PRIORITY CLAIM

This application claims the benefit of priority from U.S. Provisional Application No. 60/764,741, filed Feb. 1, 2006, which is incorporated by reference herein in its entirety.

FIELD

The present application relates to a method and apparatus for reducing the voltage swing for a logic circuit and more specifically, a method and apparatus for reducing the voltage swing for a domino logic circuit to reducing the active and standby mode power consumption and enhance the noise immunity.

BACKGROUND

Domino logic circuit techniques have been used in modern high performance microprocessors because of the superior speed and area characteristics of the dynamic circuits as compared to the static CMOS circuits. However, the domino logic gates used in the domino logic circuit typically consume more dynamic switching power and display weaker noise immunity as compared to the static CMOS gates used in the static CMOS circuits. The low power and error free operation of domino logic circuits is a major challenge in the current CMOS technologies.

The domino logic circuits may include: (1) a precharge circuit that pre-charges one or more nodes in the circuit to a predetermined value; (2) a keeper circuit that keeps or maintains the node in the circuit at the predetermined value; (3) an input circuit that inputs one or more signals and that determines the value to output on the output circuit; and (4) an output circuit.

One example of a domino logic circuit is shown in FIG. 1. The domino logic circuit shown in FIG. 1 includes a single power supply and a single ground voltage. Further, the domino logic circuit includes a transistor connected between the pull-down network and ground, thereby making the domino logic circuit "footed." The pre-charge circuit comprises a pull-up transistor (pull-up). During operation in the precharge phase, the clock signal is low. The dynamic node may thus be charged to the power supply voltage ($V_{DD}$) by the pull-up transistor. The output node is discharged to the ground voltage ($V_{gnd}$) by the output inverter. During operation in the evaluation phase, the clock signal transitions to high. After which, the pull-up transistor is cut-off. In order to maintain the dynamic node at its precharged value, a keeper circuit (keeper) may be used. One example of a keeper circuit, shown as a switch, is illustrated in FIG. 1.

The domino circuit may also include an input circuit, which may include logic for inputting one or more signals and determining the value to output on the output circuit. Any logic may be used for the input circuit including OR, AND, NAND, NOR, XOR, etc. For example, FIG. 1 shows a pull-down network as an input circuit. Depending on the inputs to the pull-down network, the dynamic node is discharged to $V_{gnd}$. The domino circuit may further include an output circuit. The output circuit may, at its input, be connected to or in communication with the dynamic mode, and at its output, be connected to the next stage of the circuit. During the evaluation phase, the output node voltage may transition to $V_{DD}$. The dynamic and output nodes are charged/discharged in every clock cycle provided that the inputs are maintained high. The dynamic switching power consumption of a domino gate is, therefore, higher than a static CMOS gate.

Attempts have been made to reduce the power consumption in domino logic circuits. FIG. 2 shows one example of a low swing circuit technique attempting to reduce the power consumption in domino logic circuits. The circuit depicted in FIG. 2 reduces the voltage swing at the output while maintaining a full voltage swing signal at the dynamic node of a domino gate. As shown in FIG. 2, the domino logic circuit relies on an additional capacitor C1 to stabilize the reference voltage; however, this design significantly increases the circuit area. Others have attempted similar low swing domino circuits that suffer from a variety of problems including degraded evaluation speeds and in achieving a smaller area overhead. Further, the power-delay product (PDP) issue is not addressed.

FIG. 3 shows another example of a dynamic node low swing domino circuit with single power supply and ground voltage. As shown in FIG. 3, the circuit utilizes NMOS and PMOS transistors to reduce and increase, respectively, the upper and lower boundary of the voltage swing at the dynamic node. Although the dynamic switching power is reduced, the output inverter is always simultaneously turned on, thereby producing significant short-circuit current. Since the pull-up and pull-down transistors are simultaneously activated in the output inverter, the output voltage swing is degraded. Similarly, the evaluation speed is significantly reduced. Therefore, what is needed is a low swing domino logic circuit that reduces power consumption without suffering the drawbacks of prior low swing circuits.

BRIEF SUMMARY

A low swing domino logic circuit is provided. The domino logic circuit may include a precharge circuit for precharging a dynamic node to a predetermined value, an input circuit that includes logic for determining a value of the dynamic node based on one or more inputs, and an output circuit in communication with the dynamic node. The dynamic node may be operated at a voltage swing that is different than the voltage swing at the output for the output circuit. For example, the voltage swing at the dynamic node may be smaller than the voltage swing at the output for the output circuit. Or, the voltage swing at the dynamic node may be greater than the voltage swing at the output for the output circuit. Further, the domino logic circuit may use dual $V_t$, with one or more transistors in the precharge circuit or the output circuit having a higher threshold voltage than one or more transistors in the input circuit, thereby reducing the short-circuit current during operation. The dual $V_t$ may be accomplished by body biasing, transistor design, or a combination of both. For example, an output circuit may include an inverter, with one or both of the transistors in the inverter having a higher threshold voltage. The domino logic circuit may further include a keeper circuit for keeping the dynamic node at the predetermined value after the precharge circuit precharges the dynamic node to the predetermined value. One or more of the transistors in the keeper circuit may have a higher threshold than the transistors in the input circuit.

As discussed above, the domino logic circuit may have the voltage swing at its output be less than the voltage swing at the dynamic node. To accomplish this, the power, ground, or both to the output circuit may be different from the power and ground to the precharge and input circuit. Or, the output low swing domino circuits may utilize transistors, such as NMOS transistors, to reduce the upper boundary of the voltage swing at the output node. The output low voltage swing circuit may permit the optimization of the output node voltage swing, thereby minimizing PDP. Meanwhile, a greater voltage swing, such as full voltage swing, may be maintained at the dynamic nodes for high speed operation.

Further, the domino logic circuit disclosed may have the voltage swing at the dynamic node that is less than the voltage swing at its output node. The voltage swing at the dynamic mode may be asymmetric to the voltage swing at its output node. The asymmetry of the voltage swing at the dynamic mode may optimize the speed or power consumption of the domino logic circuit. For example, the dynamic node may include a dynamic node high voltage and a dynamic node low voltage, and the output node may include an output node high voltage and an output node low voltage. One, or both, of the dynamic node high voltage and a dynamic node low voltage may be different from the output node high voltage and an output node low voltage. And, the difference between the output node high voltage and dynamic node high voltage may be greater than a difference between the dynamic node low voltage and output node low voltage. In this manner, the voltage swing at the dynamic node may be asymmetrical to the voltage swing at the output node.

The foregoing summary has been provided only by way of introduction. Nothing in this section should be taken as a limitation on the following claims, which define the scope of the invention.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE EMBODIMENTS

Low swing domino logic circuits are provided. The circuits may modify the upper and/or lower boundaries of the voltage swing at the dynamic node while maintaining full voltage swing signals at the inputs and outputs for high speed operation. These circuits may significantly reduce the energy required to charge/discharge the dynamic node of a domino gate without significantly increasing the evaluation delay. Further, the circuits may reduce the PDP and enhance the noise immunity.

Figure 1:
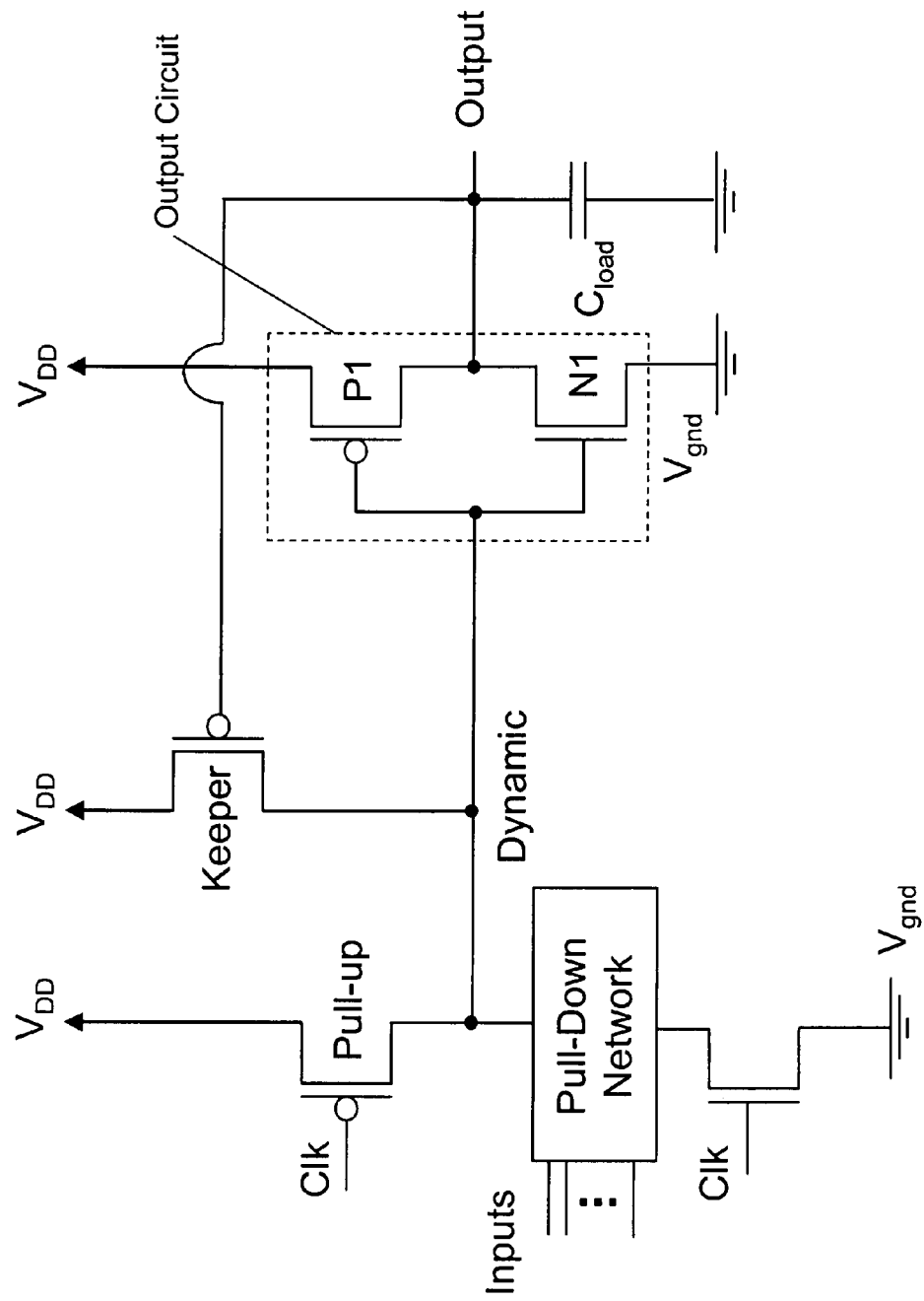
FIG. 1 is a schematic of one example of a prior art domino logic circuit.
Figure 2:
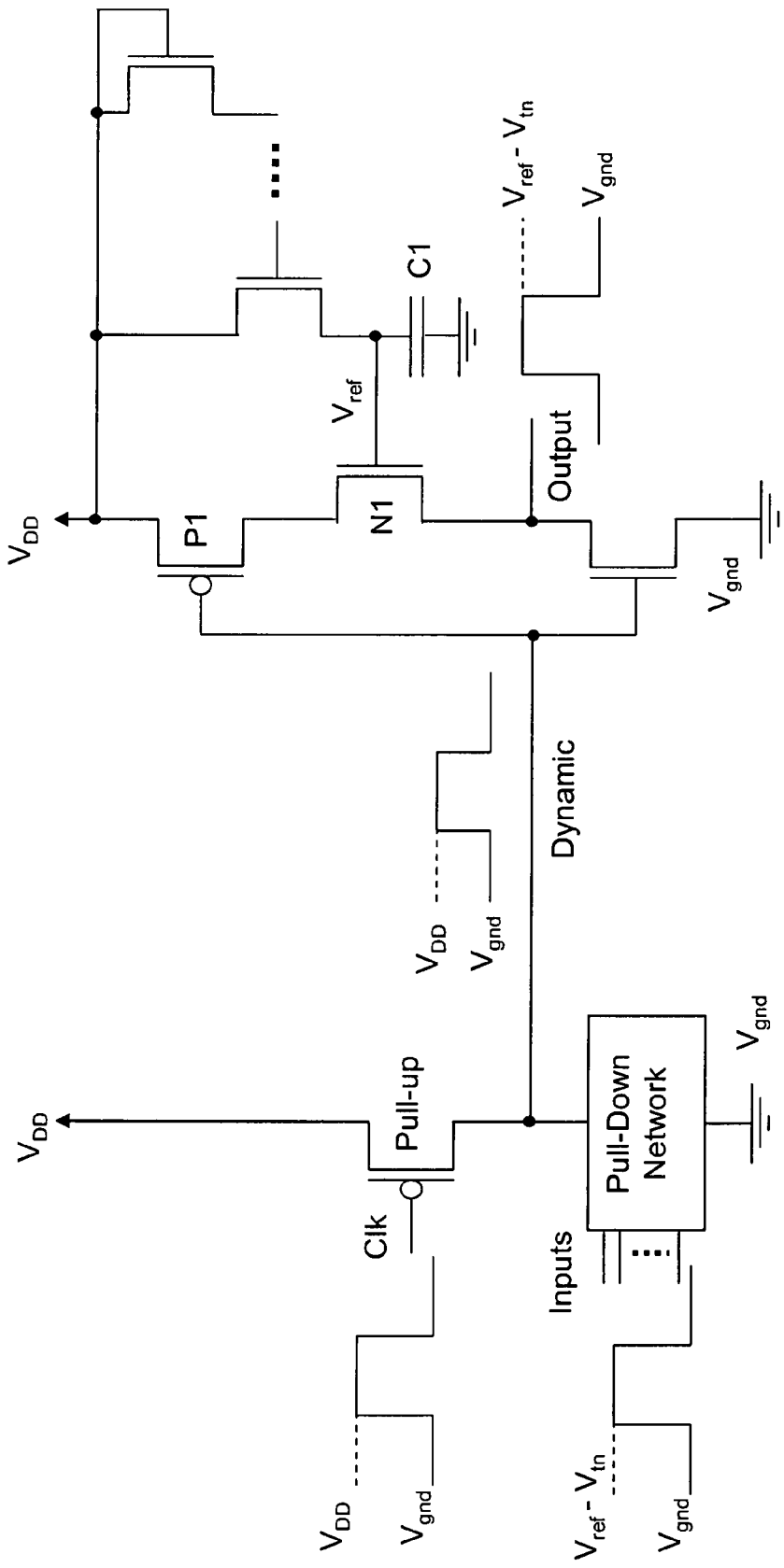
FIG. 2 is a schematic of another example of a prior art domino logic circuit.
Figure 3:
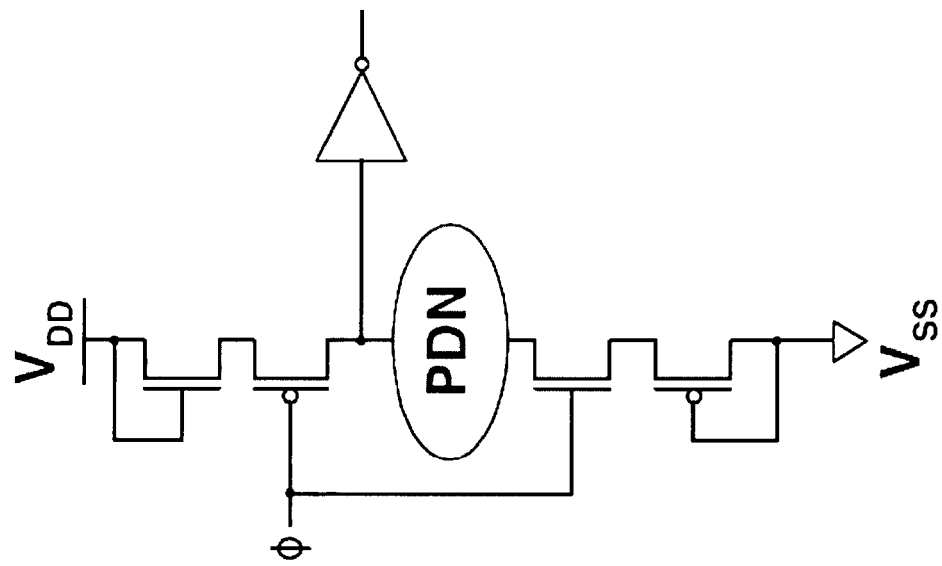
FIG. 3 is a schematic of yet another example of a prior art domino logic circuit.
Figure 4:
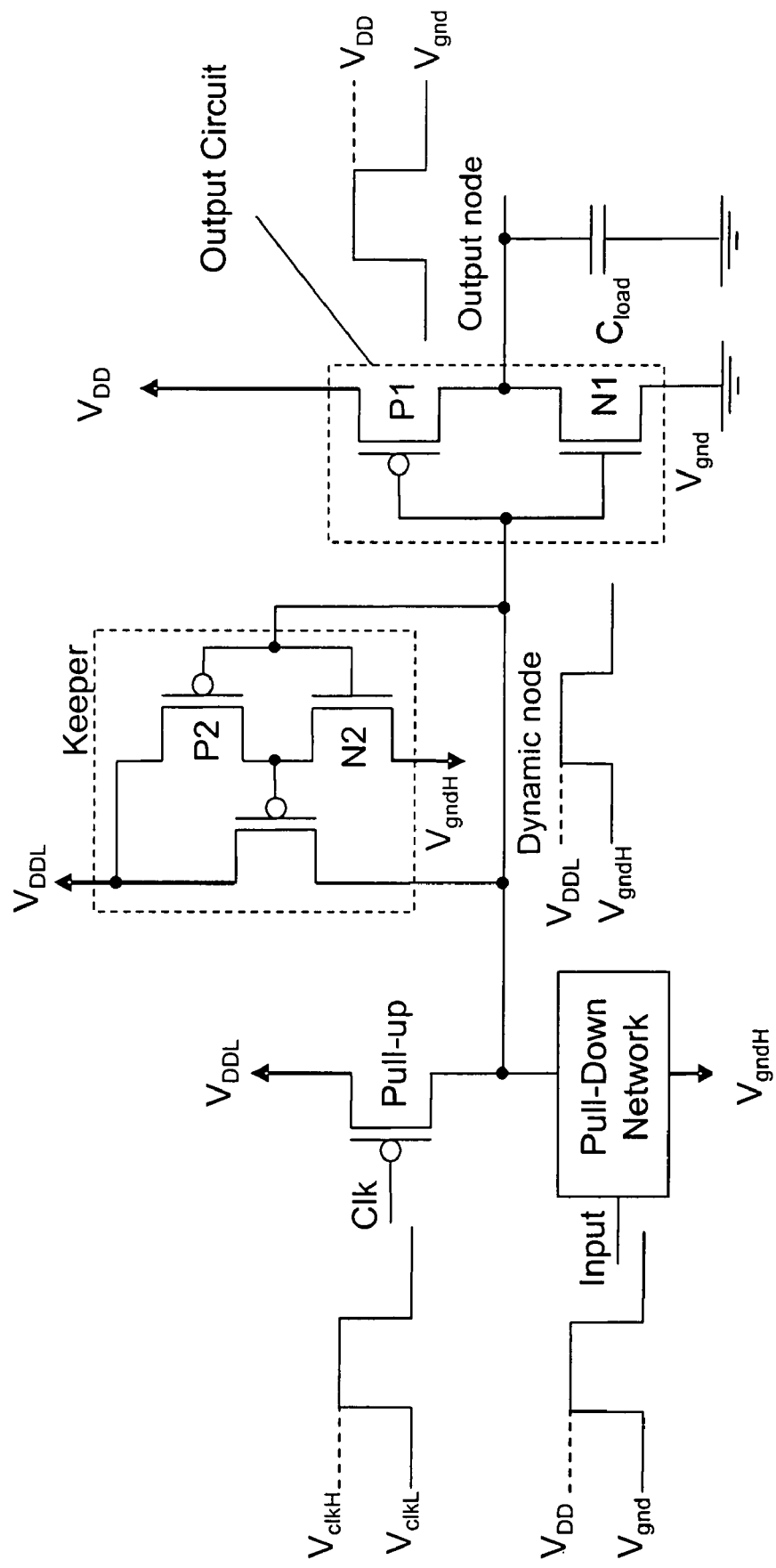
FIG. 4 is a schematic of a footless bidirectional dynamic node low voltage swing domino logic circuit with dual power supplies and ground voltages where one or more of the power supplies may be optimized.
Figure 5:
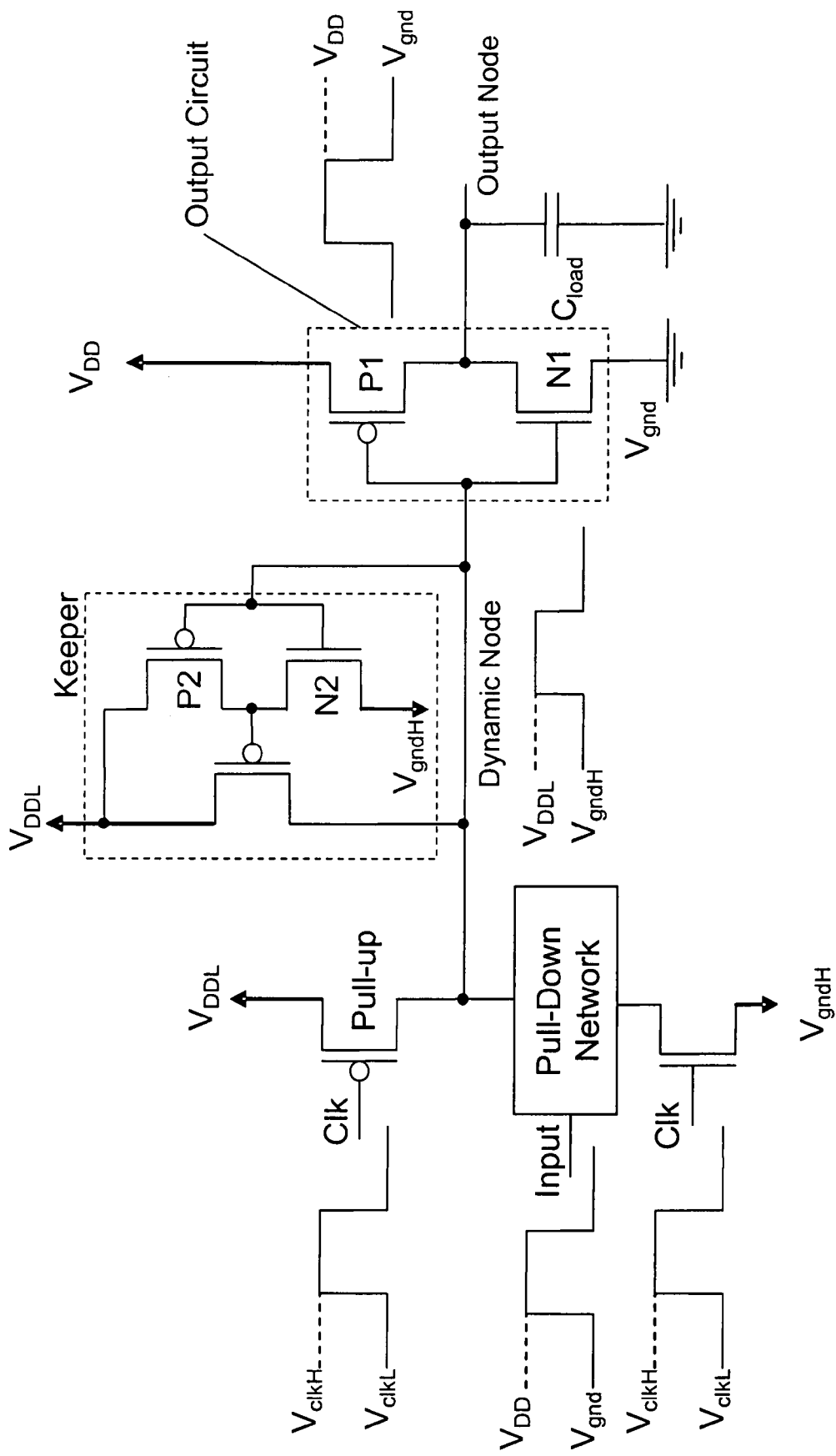
FIG. 5 is a schematic of a footed bidirectional dynamic node low voltage swing domino logic circuit with dual power supplies and ground voltages where one or more of the power supplies may be optimized.

In one aspect, the circuit comprises separate power and/or ground supplies for various portions of the circuit. One example of separate power and/or ground supplies is depicted in FIGS. 4 and 5. Specifically, the schematics of bidirectional dynamic node low voltage swing circuits utilizing dual power supply and ground voltages are shown in FIGS. 4 and 5. Referring to FIG. 4, there is shown a schematic of a footless bidirectional dynamic node low voltage swing domino logic circuit with dual power supplies and ground voltages. The keeper is driven with a low-swing signal. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$. Referring to FIG. 5, there is shown a schematic of a footed bidirectional dynamic node low voltage swing domino logic circuit with dual power supplies and ground voltages. The keeper may be driven with a low-swing signal. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$.

As shown in FIGS. 4 and 5, the pull-up switch may comprise a pull-up transistor, the input circuit may comprise a domino logic portion (such as a pull-down network that receives various inputs), the keeper circuit may comprise an inverter and a switch, and the output portion of the circuit may comprise an inverter. The output inverter may be connected to the standard power supply and ground ($V_{DD}$ and $V_{gnd}$). Though the domino logic circuits in FIGS. 4 and 5 include a keeper circuit, a keeper circuit may not be necessary if the dynamic node sufficiently maintains its charge during operation of the domino logic circuit. For example, if the switching of the domino logic circuit is faster than the time for discharge of the dynamic mode, the keeper may not be necessary to maintain the dynamic node at the precharged value.

Alternatively, the pull-down network, the keeper, and the pull-up transistor may be connected to the low-swing power supply and ground voltages ($V_{DDL}<V_{DD}$ and $V_{gndH}>V_{gnd}$). The clock may be a standard full-swing signal ($V_{clkH}=V_{DD}$ and $V_{clkL}=V_{gnd}$). Alternatively, the voltage swing of the clock signal can also be low and may be the same voltages as that used to power the pull-down network and the pull-up transistor ($V_{clkH}=V_{DDL}$ and $V_{clkL}=V_{gndH}$; $V_{clkH}=V_{DD}$ and $V_{clkL}=V_{gndH}$; $V_{clkH}=V_{DDL}$ and $V_{clkL}=V_{gnd}$) in order to reduce the dynamic switching power consumption of the clock distribution network.

The operation of the schematics depicted in FIGS. 4 and 5 behave in the following manner. In the precharge phase, the clock may be low. The dynamic node may be charged to $V_{DDL}$ by the pull-up transistor. In the output portion, N1 may be turned on and P1 may be weakly inverted. The output node may be discharged to $V_{gnd}$ by N1. The evaluation phase may begin when the clock transitions high. The dynamic node may be discharged to $V_{gndH}$ through the pull-down network provided that the inputs are high. In the output portion, P1 may be turned on and N1 may be weakly inverted. The output node may be charged to $V_{DD}$ by P1.

The voltage swing at the dynamic node may be from $V_{gndH}$ to $V_{DDL}$ while the voltages at the output and input nodes may be maintained full swing between $V_{gnd}$ and $V_{DD}$. The active mode power consumption of the schematics depicted in FIGS. 4 and 5 may be reduced since the power required to charge/discharge the dynamic node is lower as compared to the standard full-swing domino logic circuits. For example, the switching power consumed to charge/discharge the dynamic node may be quadratically reduced with the voltage swing. And, full voltage swing signals are maintained at the inputs and outputs may enable high speed and robust operation. The noise immunity may also enhanced since the gate-to-source voltage ($V_{gs}$) of the pull-down network transistors is negative (a higher noise signal may be needed to activate the transistors in the pull-down network). In addition, in order to suppress the short circuit current produced by the output circuit (e.g., an output inverter as shown in FIGS. 4 and 5), high threshold voltage (high-$V_t$) transistors may be employed in the output circuit.

The selection of the voltage swing at the dynamic node of $V_{gndH}$ to $V_{DDL}$ and/or the selection of the high-$V_t$ may be optimized for reducing PDP and enhancing noise immunity as compared to standard full-swing circuits. As discussed in more detail below, employing a dual $V_t$ CMOS technology may significantly enhance the effectiveness of the bidirectional dynamic node low swing domino logic circuit. The voltage swing at the dynamic node may be asymmetric for optimization. For example, in a domino circuit with $V_{DD}=0.8V$ and $V_t\approx0.22$, the voltage swing at the dynamic node may be an asymmetric range of 0.1V to 0.6V, along with an optimized high-$V_t$ of 0.28 V in order to achieve a reduced or lowest PDP in various types of domino logic circuits in a 45 nm CMOS technology. The circuit technique may reduce the PDP by up to 51.9% and increase the noise immunity by up to 39.1% as compared to standard full-swing circuits. The active mode power consumption may be reduced by up to 40.4% and the evaluation speed may be enhanced by up to 19.4%.

Effectiveness of the circuit technique for reducing standby mode power consumption may also be evaluated. Subthreshold and gate dielectric leakage currents produced by the input circuit (e.g., the pull-down network shown in FIGS. 4 and 5) in an idle domino gate may be suppressed with the dual-$V_t$. Specifically, the dual-$V_t$ circuit may reduce the idle mode leakage power consumption by up to 84.2% as compared to standard full-swing circuits.

When dual power supply and ground voltages are utilized, the dynamic node switching power of a low swing domino logic circuit may be represented as:

$$P = \alpha C_L (V_{DDL} - V_{gndH})^2 \qquad (1)$$

$$f = \alpha C_L V_{swing}^2 f,$$

where P, a, and f are the switching power consumed for charging/discharging the dynamic node, switching activity factor, and clock frequency, respectively. $C_L$ is the capacitive load at the dynamic node. $V_{swing}$ is the dynamic node voltage swing ($V_{swing}=V_{DDL}-V_{gndH}$). The switching power consumed for charging/discharging the dynamic node may have a quadratic dependence on the dynamic node voltage swing.

The circuit technique may also lower the power consumption during the idle mode. The clock may be gated high in an idle domino logic circuit. When the clock is gated high, the pull-up transistor may be turned off, enabling that no short-circuit current conduction path exists between the low-swing power supply and ground (provided that the inputs are high in the footless domino logic circuits). The dynamic node may be cyclically charged to $V_{DDL}$ every clock period. Therefore, provided that the inputs are low after the clock is gated, the dynamic node may be maintained at $V_{DDL}$ in the idle mode. Alternatively, provided that the inputs are high after the clock is gated, the dynamic node may be discharged to $V_{gndH}$ and the output transitions to $V_{DD}$.

If the inputs are maintained low in the idle mode, the $V_{gs}$ may be negative and the drain-to-source voltage ($V_{ds}$) is smaller in the pull-down network transistors. Since the pull-down transistors may be strongly cut-off, the subthreshold leakage current may be reduced as compared to the standard full-swing circuits. Furthermore, the gate oxide leakage current produced by N1, N2, and the pull-down network transistors may be reduced due to the smaller voltage difference across the gate dielectric layer as compared to the standard full-swing domino circuits.

Alternatively, if the inputs are maintained high, the gate oxide leakage current produced by the pull-down transistors may be reduced due to the smaller voltage difference across the gate dielectric layer. Furthermore, the subthreshold leakage current produced by the pull-up transistor may also be reduced since $V_{gs}$ is positive and $|V_{ds}|$ is lower as compared to a standard full-swing domino gate.

P1 and N1 may operate in the weak inversion region when the inputs are maintained low and high, respectively, in the idle mode. The subthreshold leakage current produced by P1 may depend on the upper boundary of the voltage swing ($V_{DDL}$) at the dynamic node. Alternatively, the subthreshold leakage current conducted by N1 may depend on the lower boundary of the voltage swing ($V_{gndH}$) at the dynamic node.

Figure 6:
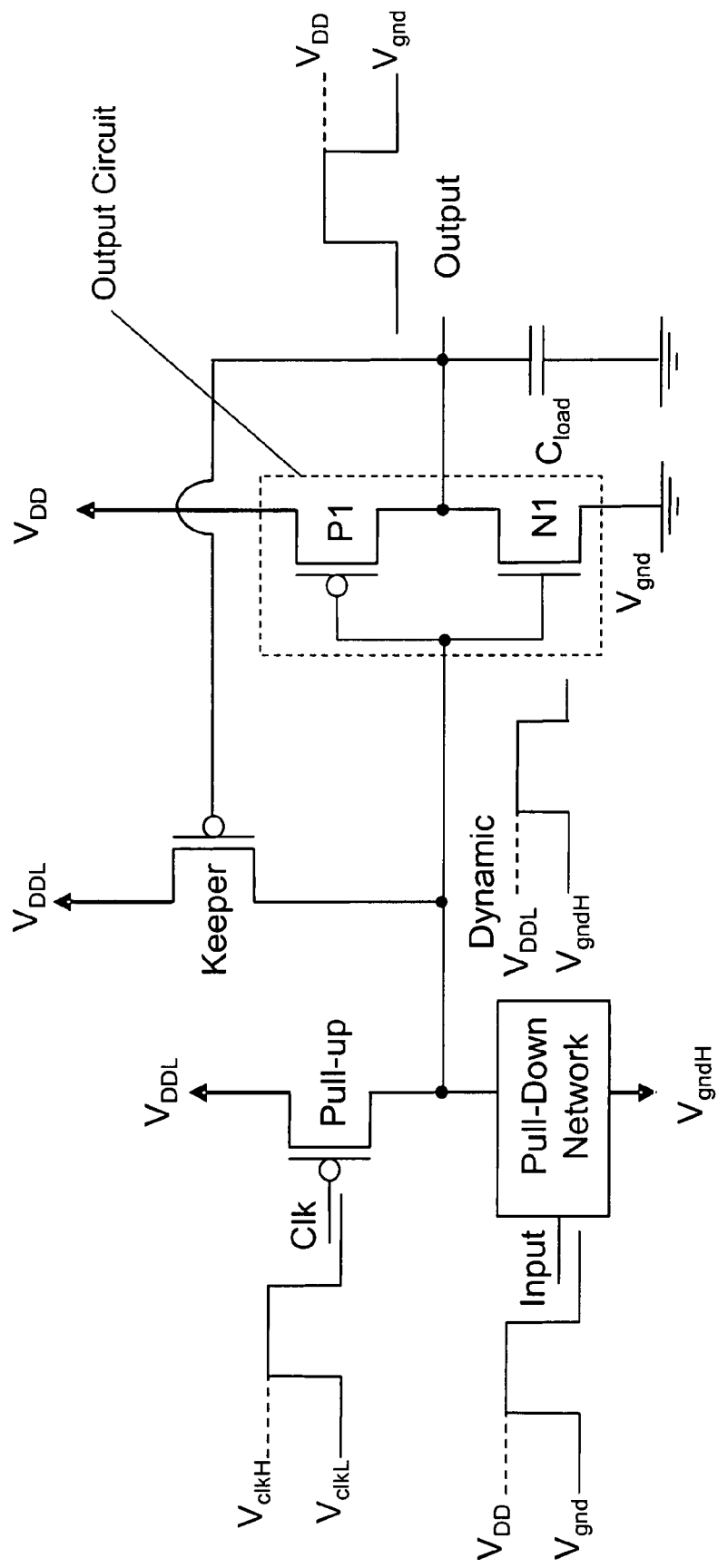
FIG. 6 is another example of a schematic of a footless bidirectional dynamic node low voltage swing domino logic circuit with dual power supplies and ground voltages where one or more of the power supplies may be optimized.
Figure 7:
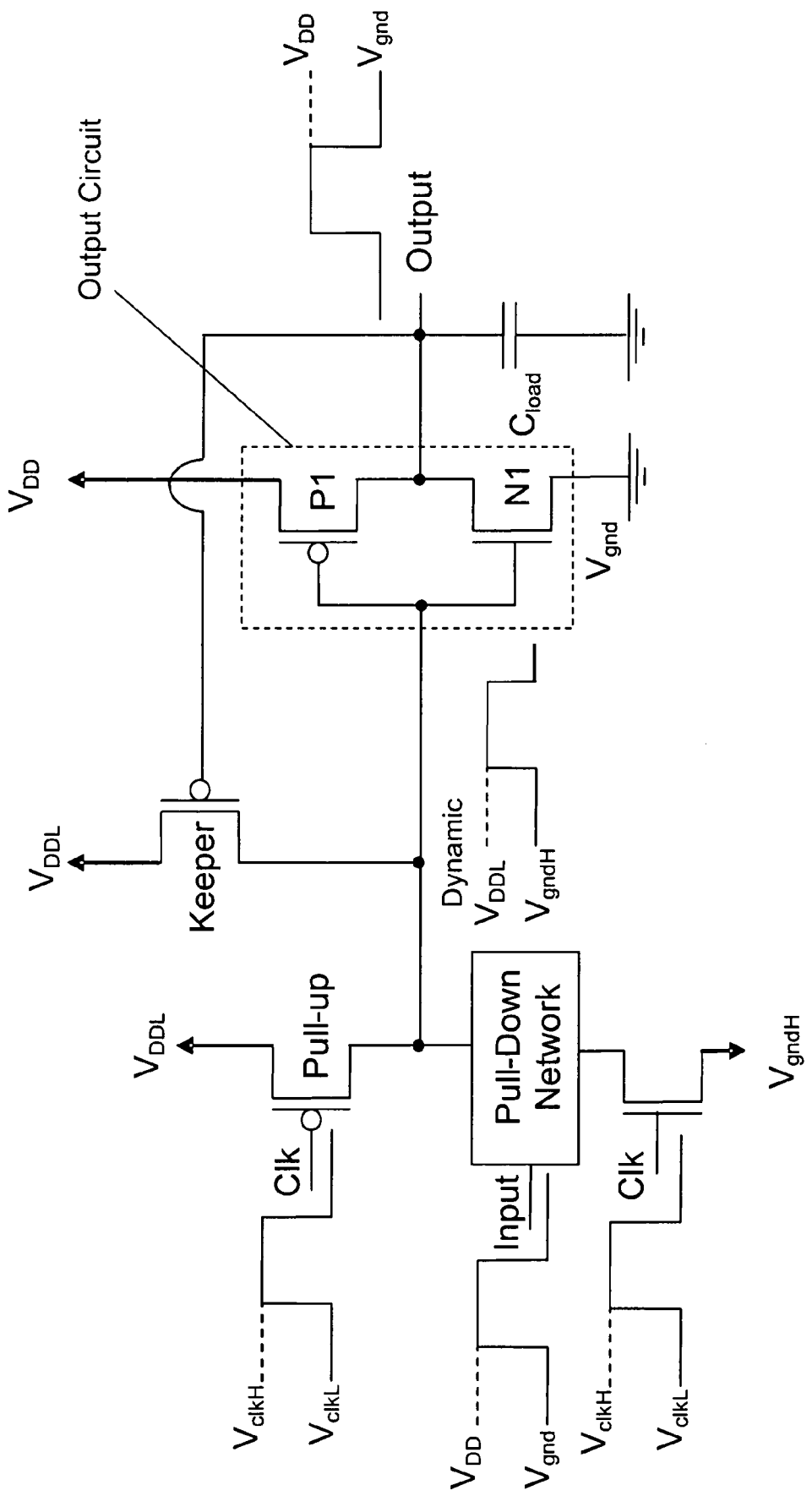
FIG. 7 is another example of a schematic of a footed bidirectional dynamic node low voltage swing domino logic circuit with dual power supplies and ground voltages where one or more of the power supplies may be optimized.

As discussed above, the keeper circuit in FIGS. 4 and 5 may comprise an inverter in series with a switch, and connected to the low-swing power supply and ground. The voltage at the gate terminal of the switch in the keeper circuit may be low-swing. The keeper contention current in the evaluation phase may be reduced, thereby enhancing the evaluation speed. A low-swing gate voltage to the switch in the keeper circuit, however, may degrade the noise immunity. The bidirectional low voltage swing circuits in which the switch in the keeper circuit is driven by a full-swing signal are shown in FIGS. 6 and 7. Specifically, FIG. 6 depicts a schematic of a footless bidirectional dynamic node low voltage swing domino logic circuit with dual power supplies and ground voltages. The keeper in FIG. 6 may be driven with a full-swing signal since it is connected to the output node, which operates at full-swing. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$. FIG. 7 depicts a schematic of a footed bidirectional dynamic node low voltage swing domino logic circuit with dual power supplies and ground voltages. Similar to FIG. 6, the keeper in FIG. 7 may be driven with a full-swing signal. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$.

Figure 8:
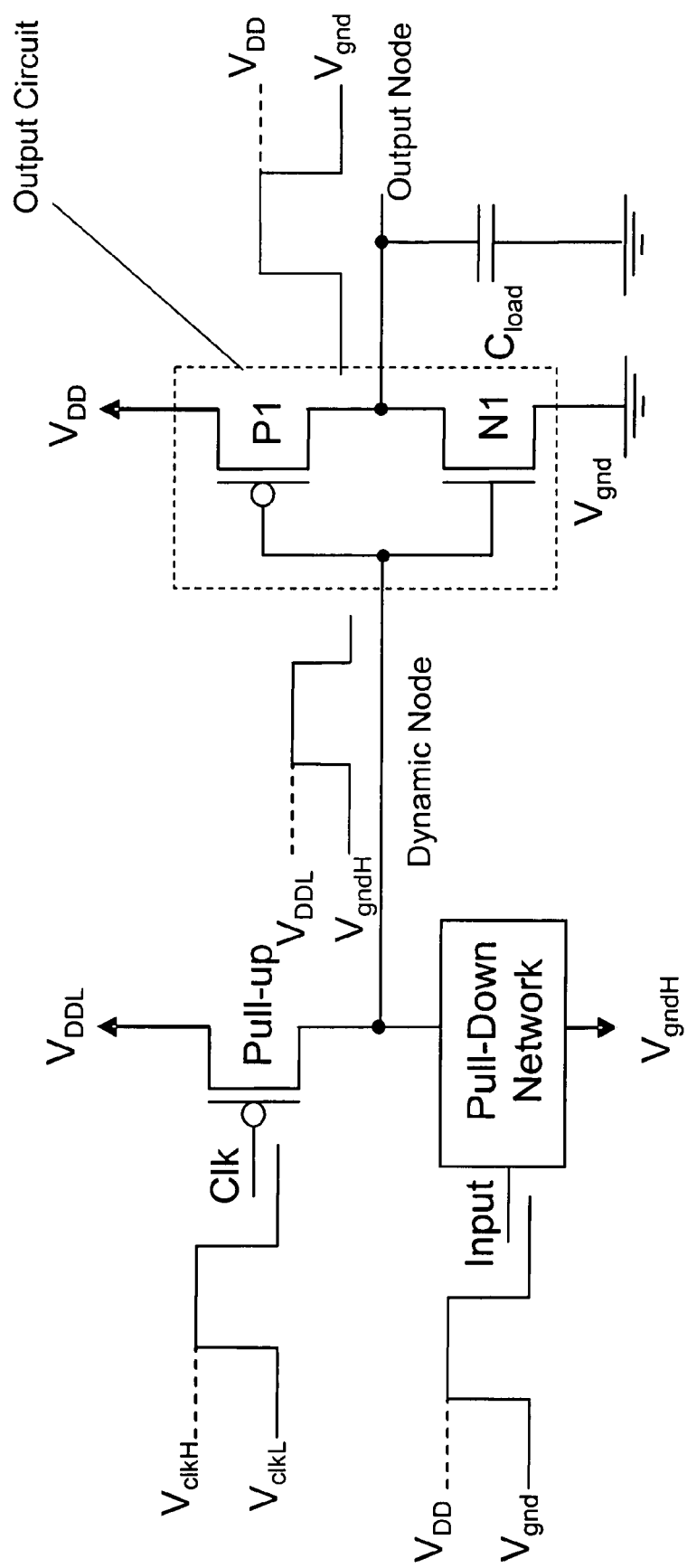
FIG. 8 is a schematic of a footless bidirectional dynamic node low voltage swing domino logic circuit with dual power supplies and ground voltages without a keeper circuit and where one or more of the power supplies may be optimized.
Figure 9:
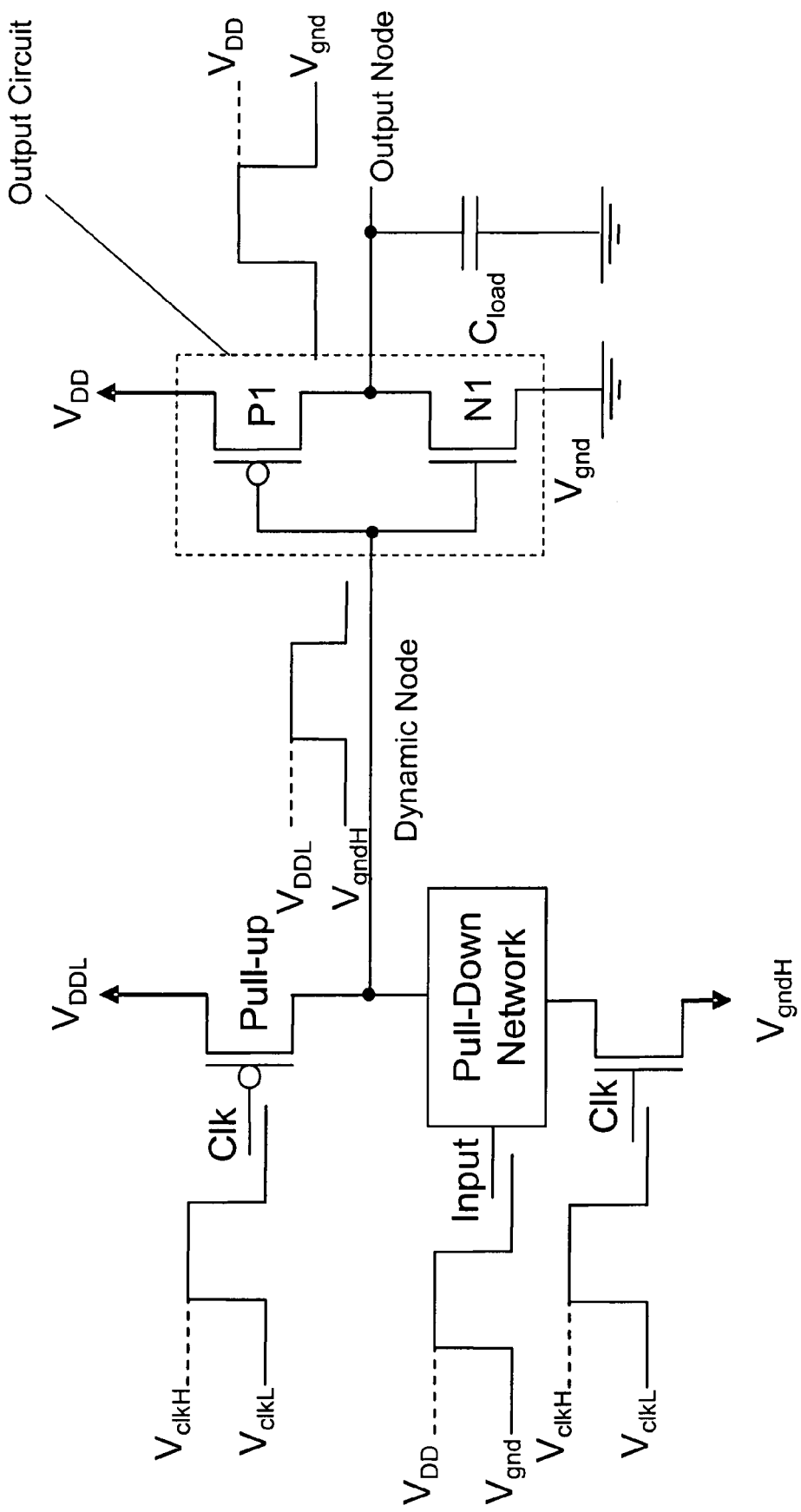
FIG. 9 is a schematic of a footed bidirectional dynamic node low voltage swing domino logic circuit with dual power supplies and ground voltages without a keeper circuit and where one or more of the power supplies may be optimized.

Maintaining a full-swing signal at the keeper gate may enhance the noise immunity. A keeper circuit may not be necessary for operation of the domino logic circuit. In particular, a domino logic circuit without a keeper may eliminate the contention current in the evaluation phase. However, the noise immunity may be degraded. Examples of bidirectional low voltage swing circuits without a keeper are shown in FIGS. 8 and 9. Specifically, FIG. 8 depicts a schematic of a footless bidirectional dynamic node low voltage swing domino logic circuit with dual power supplies and ground voltages. The keeper in FIG. 8 is removed. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$. FIG. 9 depicts a schematic of a footed bidirectional dynamic node low voltage swing domino logic circuit with dual power supplies and ground voltages. The keeper in FIG. 9 is removed. $V_{DDL}<V_{DD}$. $V_{gndH}>V_{gnd}$. $V_{clkH}=V_{DD}$ or $V_{DDL}$. $V_{clkL}=V_{gnd}$ or $V_{gndH}$.

Figure 10:
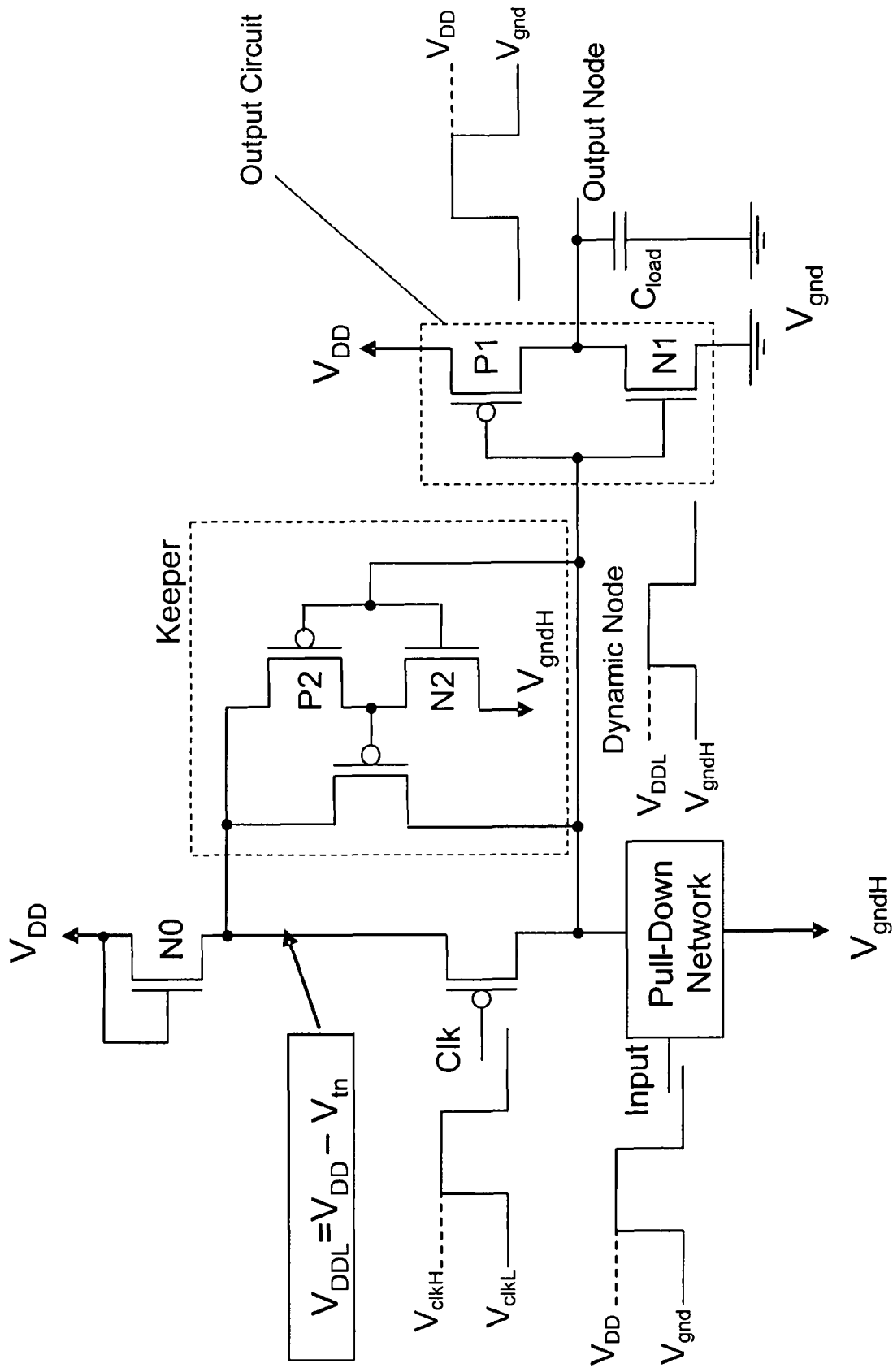
FIG. 10 is a schematic of a footless bidirectional dynamic node low voltage swing domino logic circuit with one power supply and two ground voltages where one or more of the power supplies may be optimized.
Figure 11:
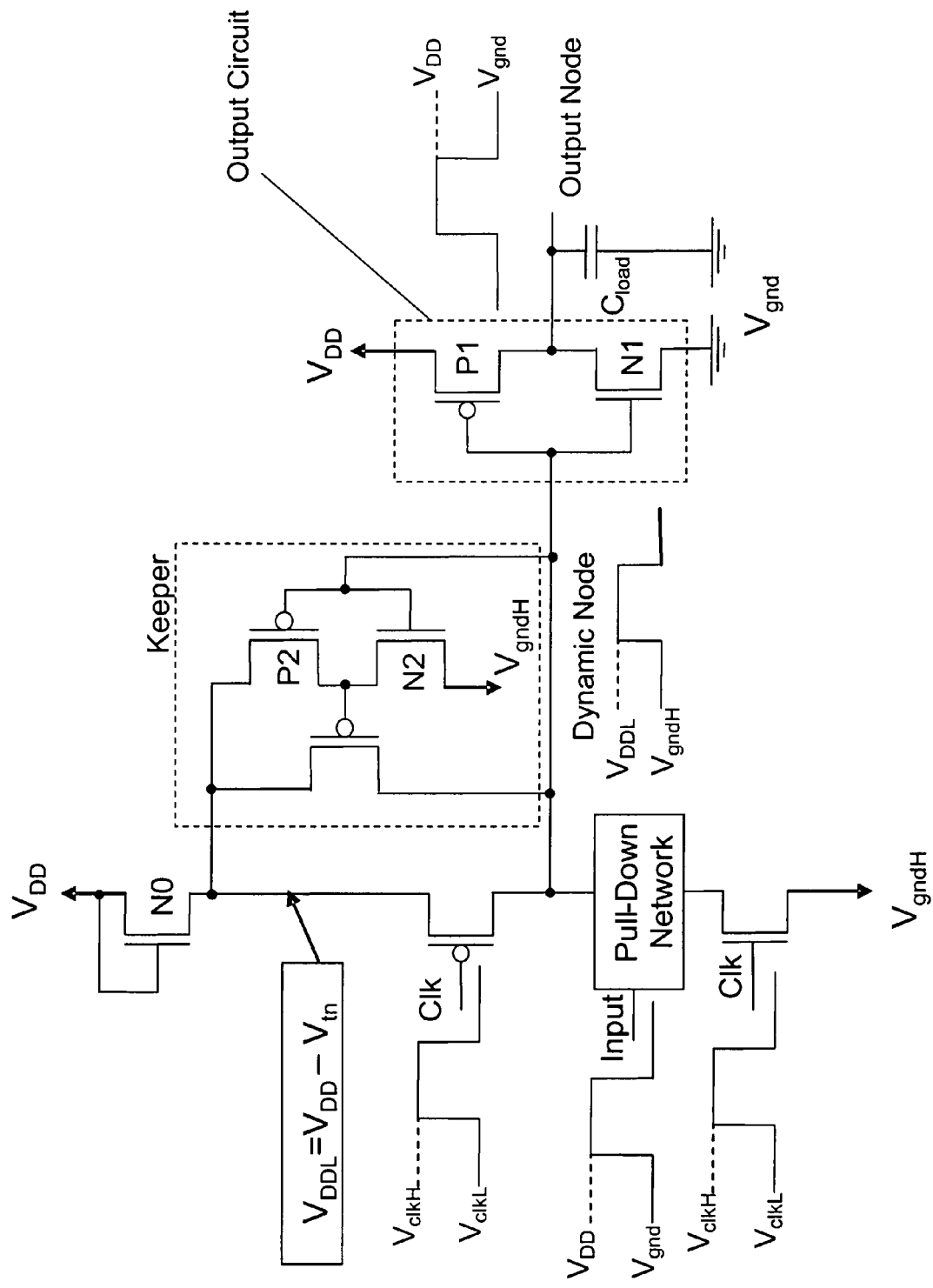
FIG. 11 is a schematic of a footed bidirectional dynamic node low voltage swing domino logic circuit with one power supply and two ground voltages where one or more of the power supplies may be optimized.

As discussed above, the bidirectional dynamic node low voltage swing circuits discussed with respect to FIGS. 4-9 utilize two power supplies and/or two ground voltages which may increase the design complexity provided that multiple power supplies are not available. Alternatively, another circuit technique may be used utilizing an NMOS transistor to produce a low-swing signal from a single standard power supply, as shown in FIGS. 10 and 11. FIG. 10 depicts a schematic of a footless bidirectional dynamic node low voltage swing domino logic circuit with one power supply and two ground voltages. The keeper in FIG. 10 may be driven with a low-swing signal, with $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. FIG. 11 depicts a schematic of a footed bidirectional dynamic node low voltage swing domino logic circuit with one power supply and two ground voltages. The keeper in FIG. 11 may be driven with a low-swing signal, with $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$.

Figure 12:
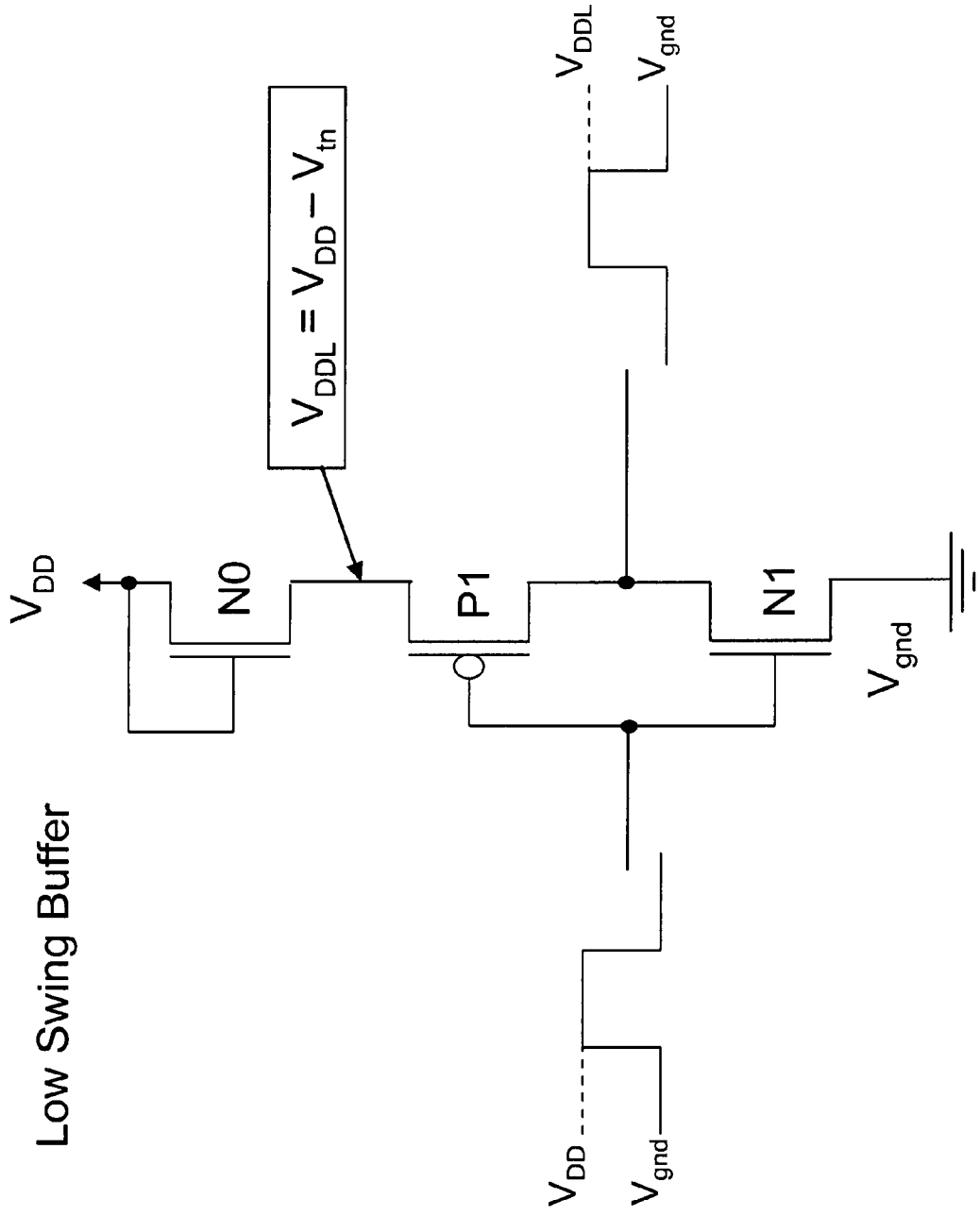
FIG. 12 is a schematic of a low swing buffer with a standard power supply and ground voltages and $V_{DDL}=V_{DD}-V_{tn}$.

The upper boundary of the dynamic node voltage swing may be $V_{DD}-V_{tn}$ (whereby $V_{tn}$ may be the threshold voltage of the NMOS transistor). The voltage swing of the clock signal may also be reduced to further decrease the switching power consumption. The clock distribution network may utilize low swing buffers to produce a low-swing clock signal from a single standard power supply. A schematic of a low swing buffer is depicted in FIG. 12 with a standard power supply and ground voltages and $V_{DDL}=V_{DD}-V_{tn}$.

Figure 13:
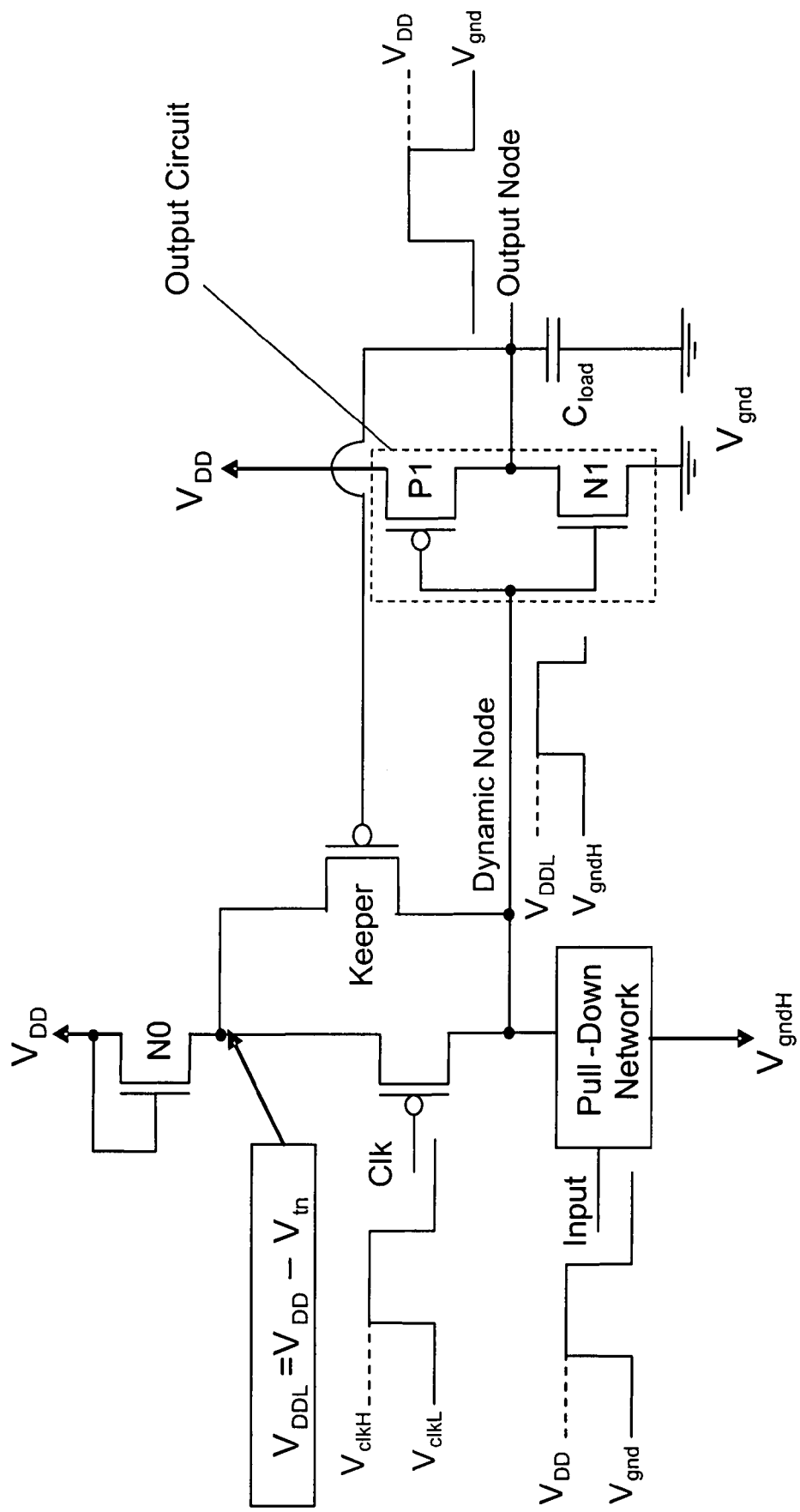
FIG. 13 is another example of a schematic of a footless bidirectional dynamic node low voltage swing domino logic circuit with one power supply and two ground voltages where one or more of the power supplies may be optimized.
Figure 14:
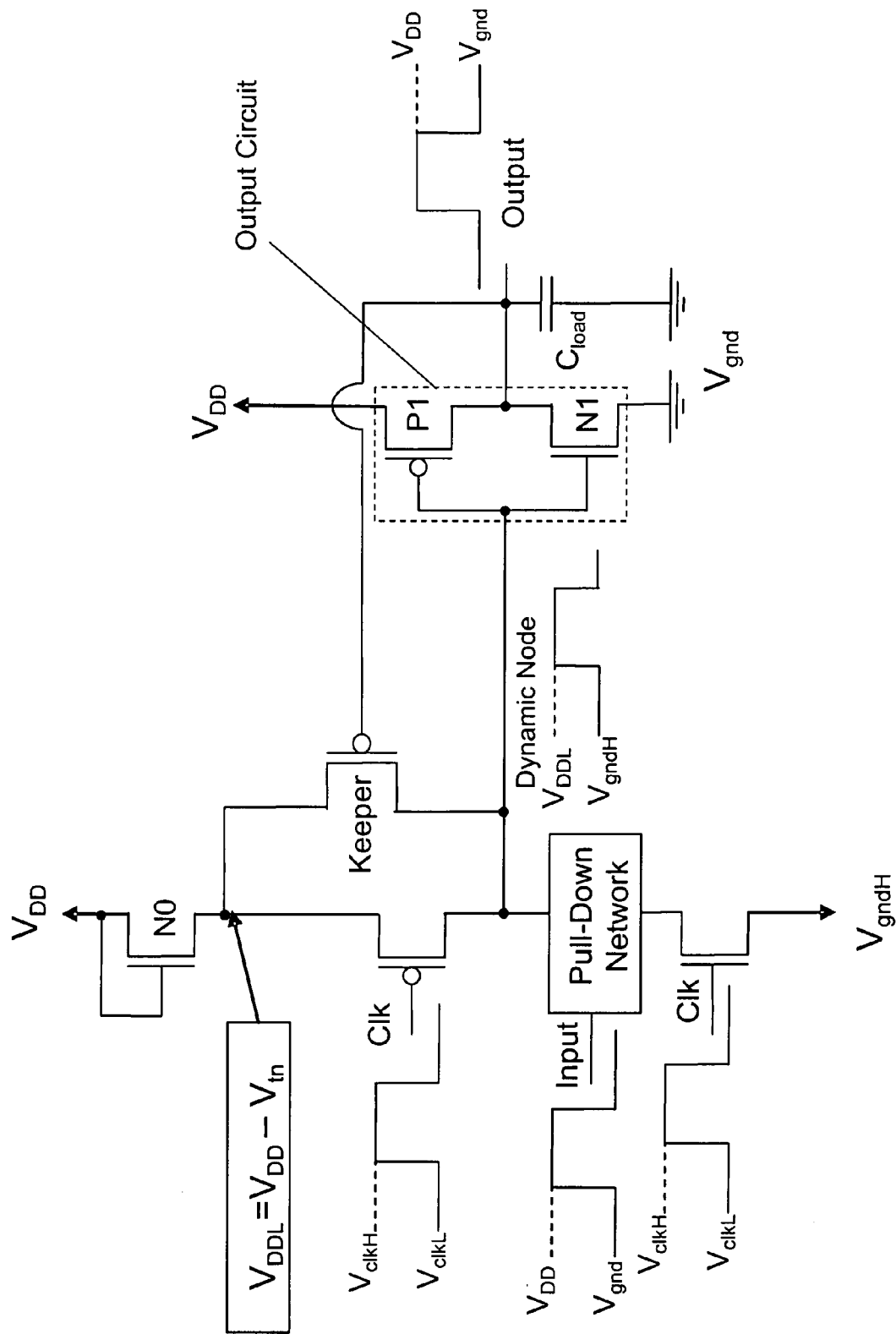
FIG. 14 is another example of a schematic of a footed bidirectional dynamic node low voltage swing domino logic circuit with one power supply and two ground voltages where one or more of the power supplies may be optimized.

In FIGS. 10 and 11, the gate terminal of the keeper may be driven by an inverter connected to the source terminal of N0 and the higher ground voltage $V_{gndH}$. The voltage at the gate terminal of the keeper may be low-swing, thereby reducing the contention current in the evaluation phase. Alternatively, maintaining a full-swing signal at the keeper gate may enhance the noise immunity while increasing the contention current. The bidirectional dynamic node low voltage swing circuits in which the keeper is driven with a full-swing signal are shown in FIGS. 13 and 14. FIG. 13 depicts a schematic of a footless bidirectional dynamic node low voltage swing domino logic circuit with one power supply and two ground voltages. The keeper in FIG. 13 may be driven with a full-swing signal. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. FIG. 14 depicts a schematic of a footed bidirectional dynamic node low voltage swing domino logic circuit with one power supply and two ground voltages.

Figure 15:
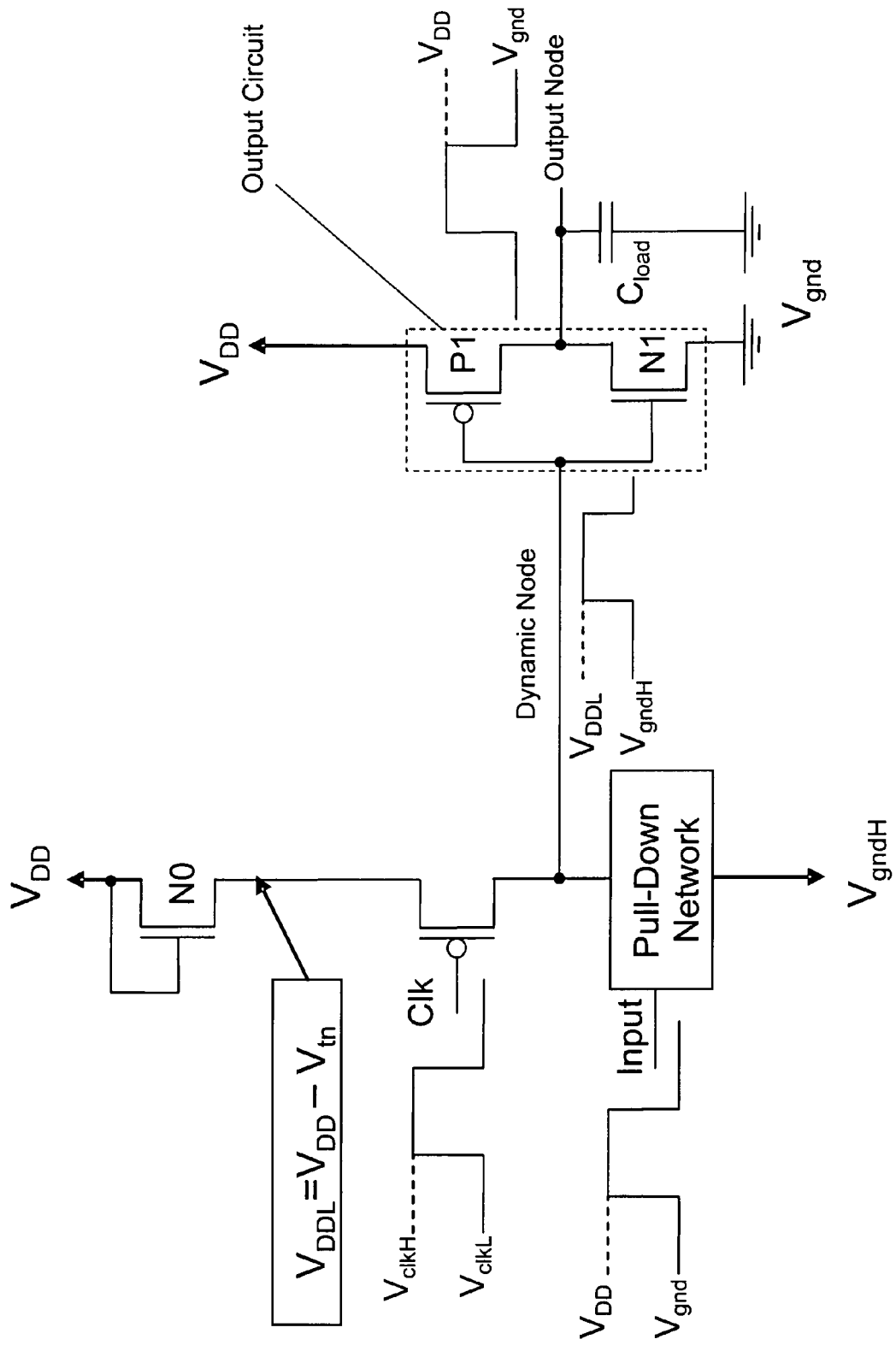
FIG. 15 is a schematic of a footless bidirectional dynamic node low voltage swing domino logic circuit with one power supply and two ground voltages, without a keeper circuit, and where one or more of the power supplies may be optimized.
Figure 16:
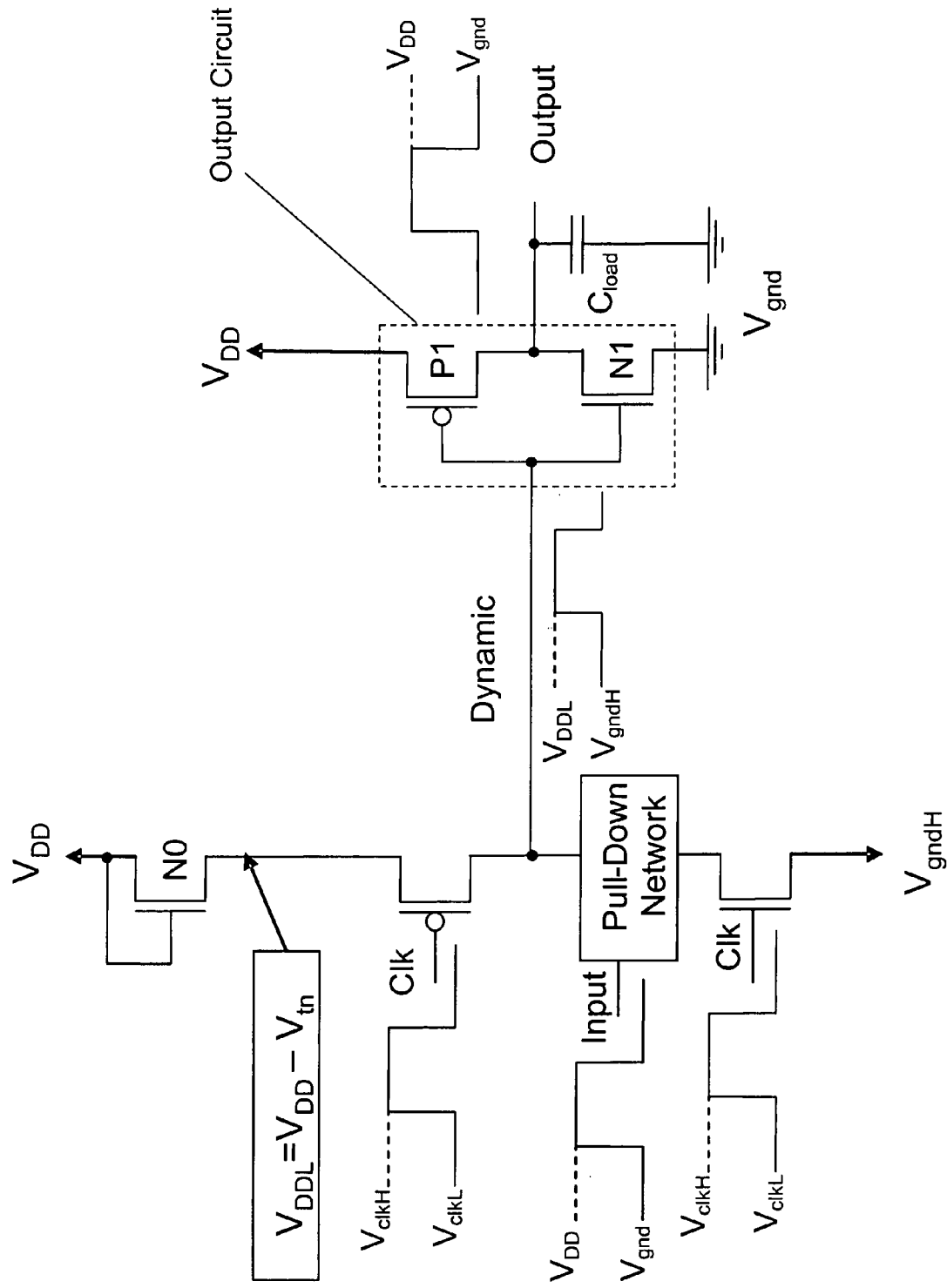
FIG. 16 is a schematic of a footed bidirectional dynamic node low voltage swing domino logic circuit with one power supply and two ground voltages, without a keeper circuit, and where one or more of the power supplies may be optimized.

The keeper in FIG. 14 may be driven with a full-swing signal. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. A domino logic circuit without a keeper may eliminate the contention current in the evaluation phase. However, the noise immunity may be degraded. The bidirectional dynamic node low voltage swing circuits without a keeper are shown in FIGS. 15 and 16. FIG. 15 depicts a schematic of a footless bidirectional dynamic node low voltage swing domino logic circuit with one power supply and two ground voltages. The keeper in FIG. 15 may be removed. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. FIG. 16 depicts a schematic of a footed bidirectional dynamic node low voltage swing domino logic circuit with one power supply and two ground voltages. The keeper in FIG. 16 may be removed. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$.

Figure 17:
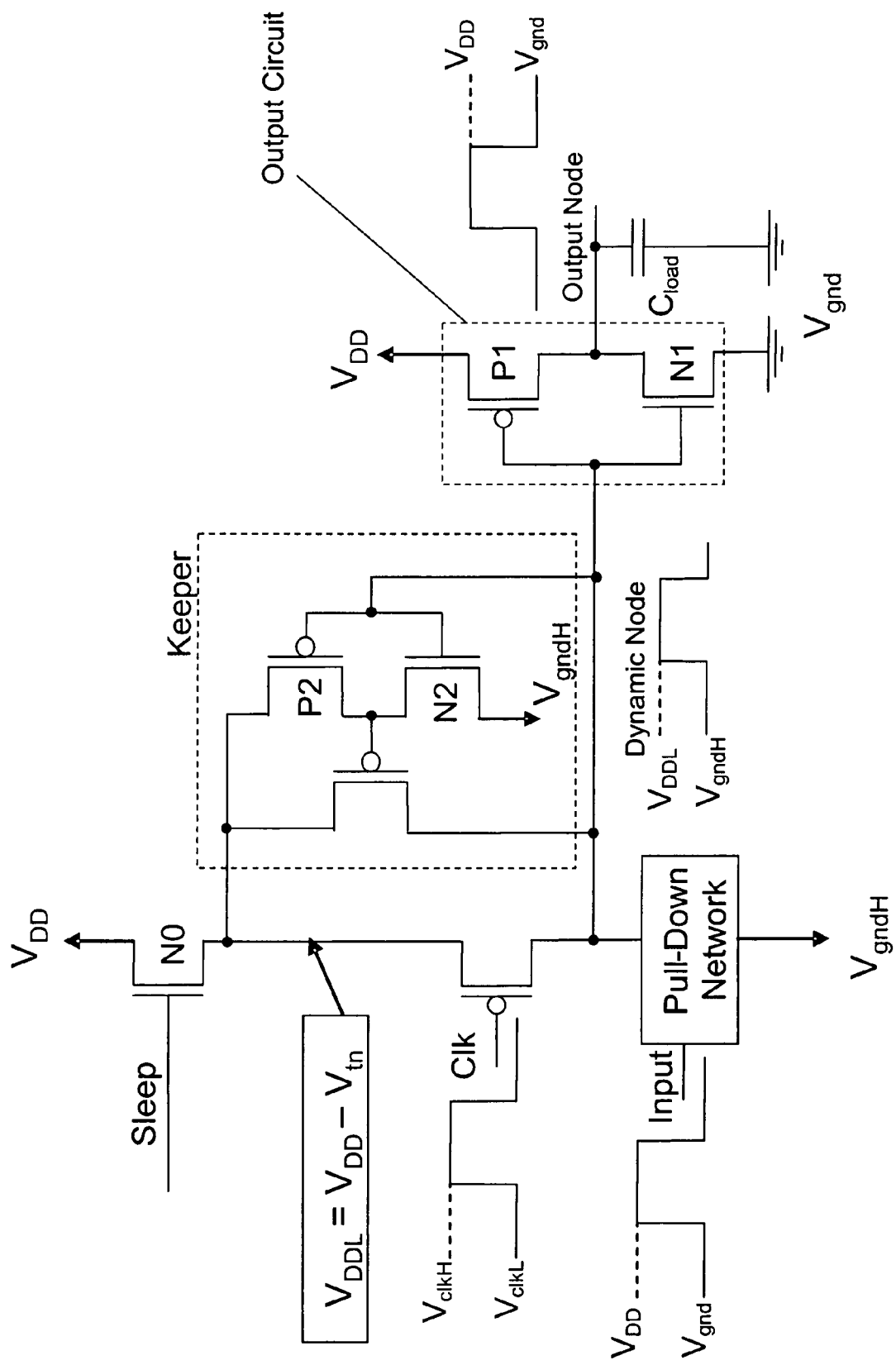
FIG. 17 is a schematic of a footless bidirectional dynamic node low voltage swing domino logic circuit with one power supply and two ground voltages, with a sleep transistor, and where one or more of the power supplies may be optimized.
Figure 18:
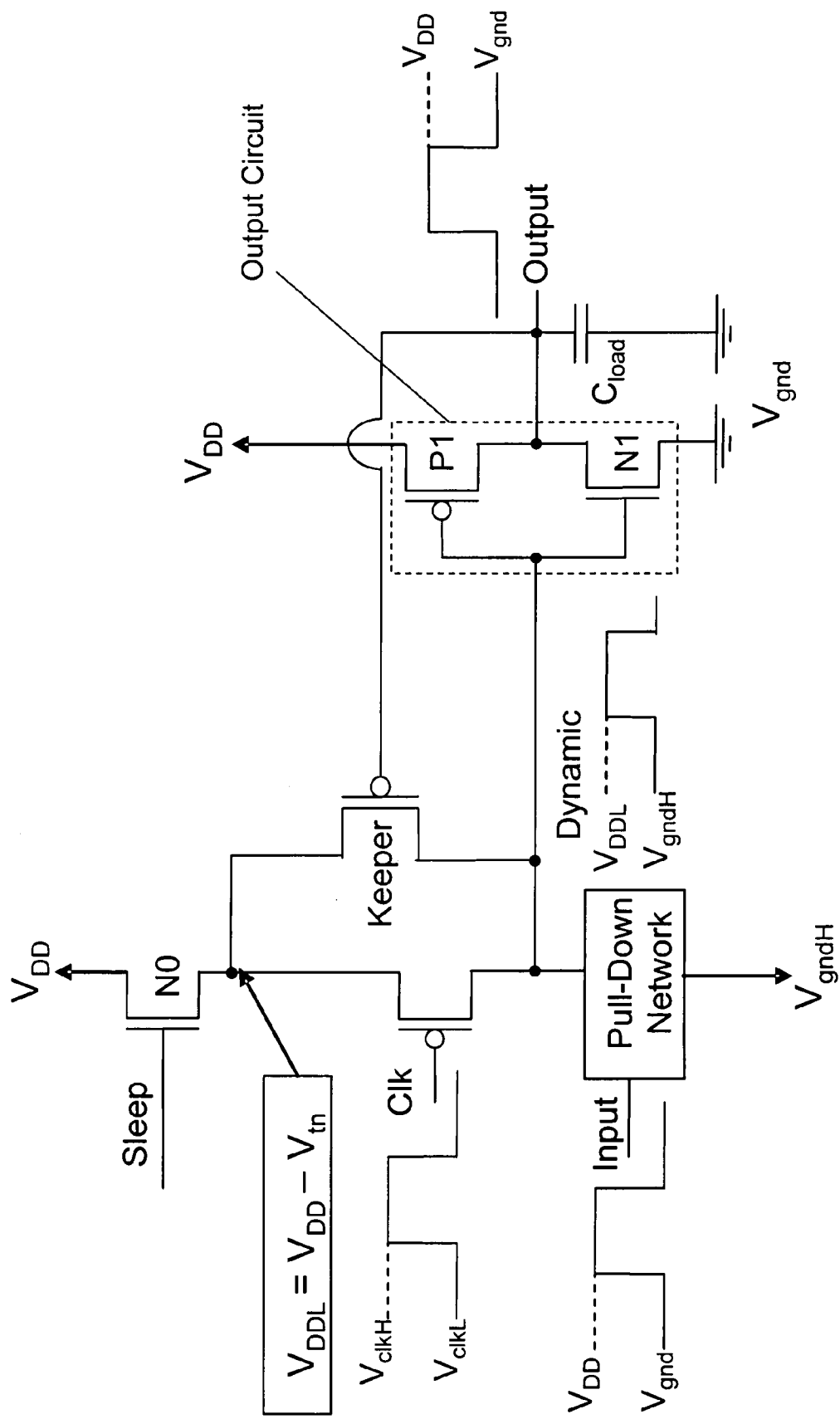
FIG. 18 is another example of a schematic of a footless bidirectional dynamic node low voltage swing domino logic circuit with one power supply and two ground voltages, with a sleep transistor, and where one or more of the power supplies may be optimized.
Figure 19:
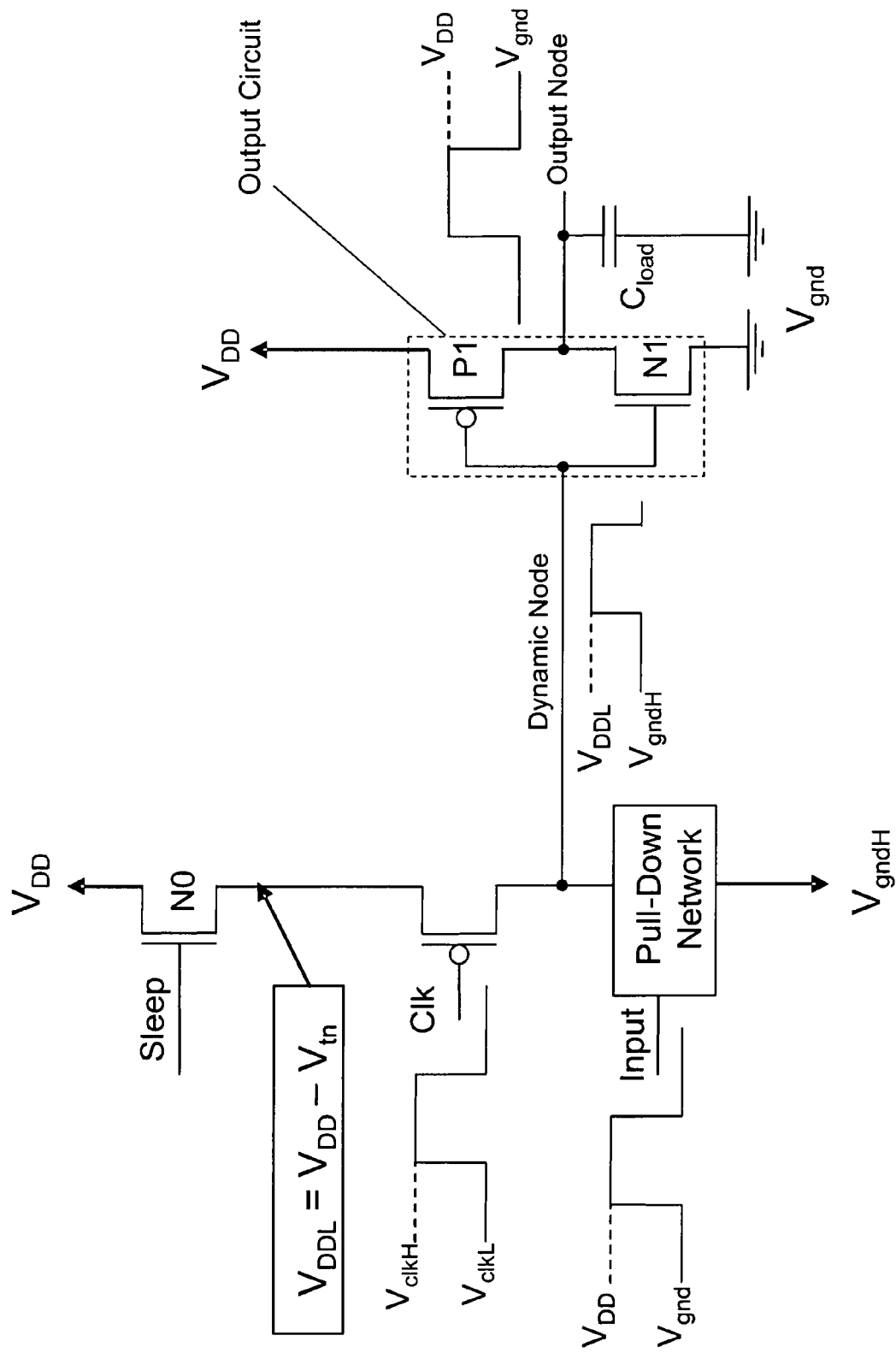
FIG. 19 is still another example of a schematic of a footless bidirectional dynamic node low voltage swing domino logic circuit with one power supply and two ground voltages, without a keeper circuit, with a sleep transistor, and where one or more of the power supplies may be optimized.

In FIGS. 10 to 16, the NMOS transistor N0 may always be active since the gate terminal of N0 is connected to $V_{DD}$. Alternatively, a transistor, such as N0, may be used as a sleep switch in order to suppress the subthreshold leakage current in an idle domino gate. N0 may be driven by a separate sleep signal as shown in FIGS. 17, 18, and 19. Specifically, the Sleep signal may be $V_{DD}$ during a portion of operation of the domino logic circuit, such as when the pull-up transistor and keeper circuit require power, and may be $V_{gnd}$ at other times. FIG. 17 depicts a schematic of a footless bidirectional dynamic node low voltage swing domino logic circuit with one power supply and two ground voltages. The keeper in FIG. 17 may be driven with a low-swing signal, and N0 may be driven by a sleep signal. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. FIG. 18 depicts a schematic of a footless bidirectional dynamic node low voltage swing domino logic circuit with one power supply and two ground voltages. The keeper in FIG. 18 may be driven with a full-swing signal, N0 may be driven by a sleep signal. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$. FIG. 19 depicts a schematic of a footless bidirectional dynamic node low voltage swing domino logic circuit with one power supply and two ground voltages. The keeper may be removed, N0 may be driven by a sleep signal. $V_{DDL}=V_{DD}-V_{tn}$. $V_{gndH}>V_{gnd}$, $V_{clkH}=V_{DD}$ or $V_{DDL}$, $V_{clkL}=V_{gnd}$ or $V_{gndH}$. In the active mode, the sleep signal may be maintained high. N0 may be turned on. The domino gates operate as the previous low swing domino circuits in FIGS. 10 to 16. In the idle mode, the sleep signal may transition to low. N0 may be cut-off, thereby reducing the subthreshold leakage current.

The inputs may drive both the PMOS and NMOS transistors in the pull-up and pull-down networks in a static CMOS logic gate. If the upper boundary of the output voltage swing is reduced, the pull-up and pull-down networks in the fan-out gates may be simultaneously activated producing short-circuit current. The short-circuit current in the fan-out gates may increase the power consumption and propagation delay while degrading the output voltage swing. Unlike the static CMOS circuits, the inputs to a domino gate may only be applied to the NMOS transistors in the pull-down network. The upper boundary of the output voltage swing of a domino gate may, therefore, be reduced without causing short-circuit current in the fan-out domino gates.

Figure 20:
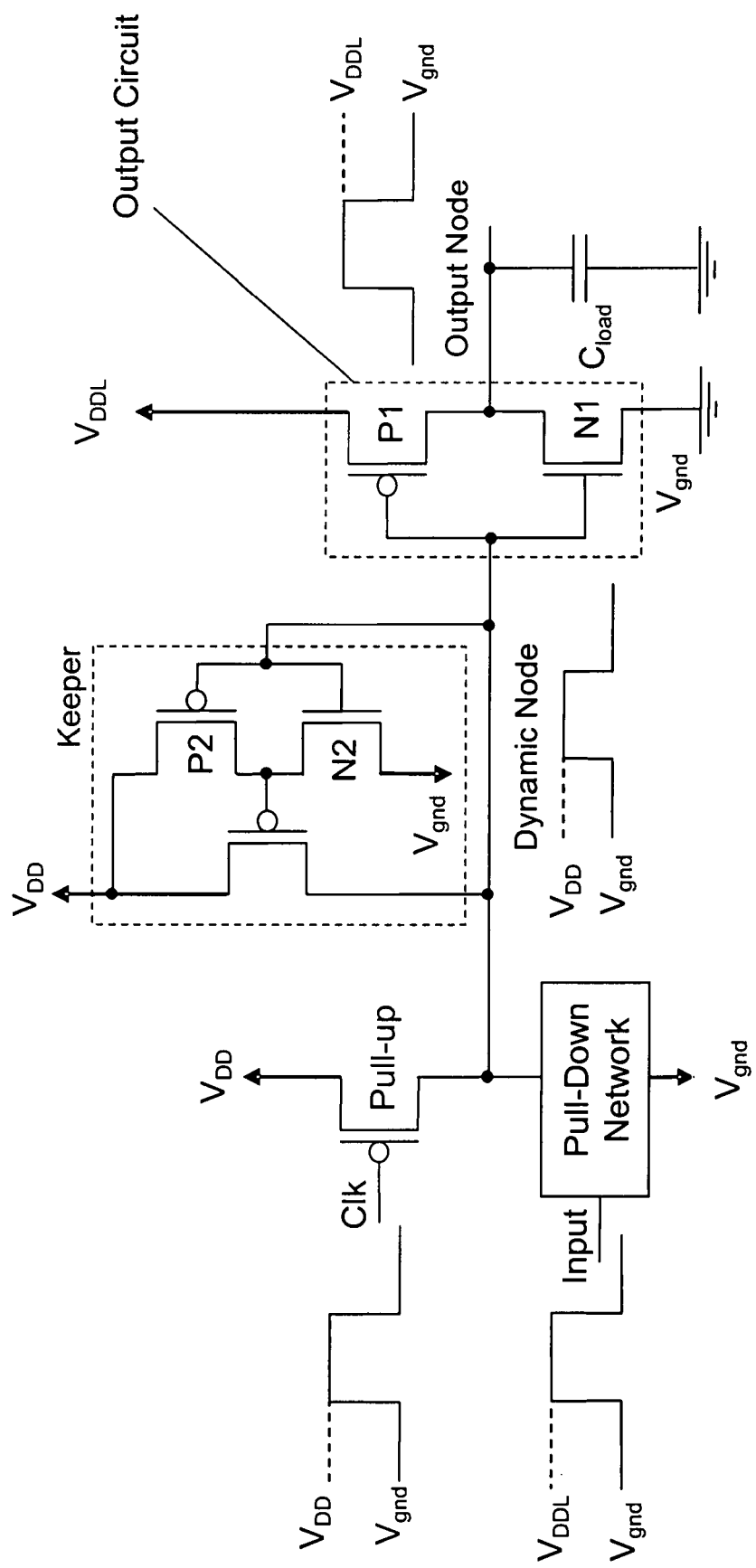
FIG. 20 depicts a schematic of a footless output low voltage swing domino logic circuit with dual power supplies, where the output is low-swing.
Figure 21:
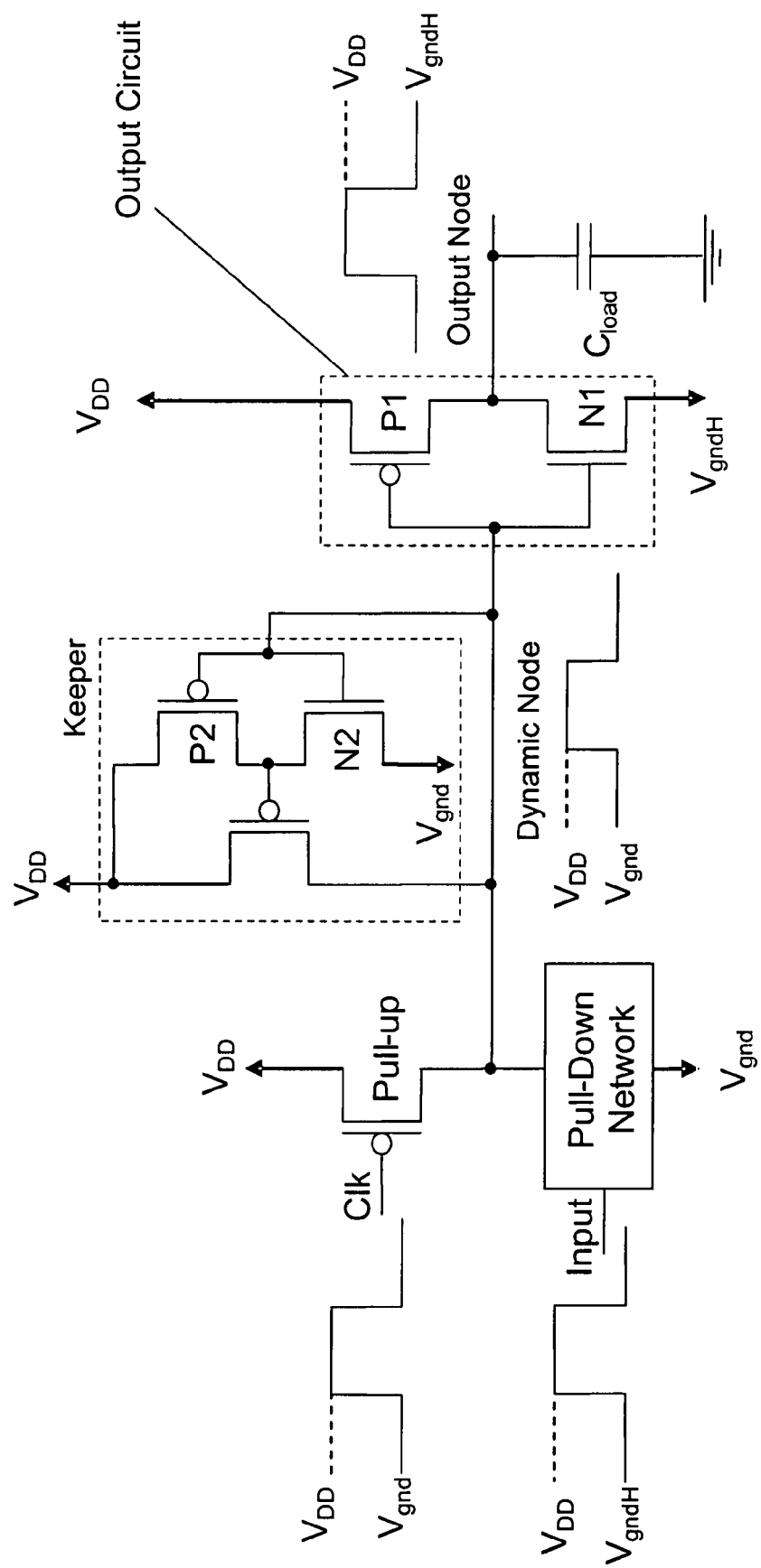
FIG. 21 depicts another schematic of a footed output low voltage swing domino logic circuit with dual power supplies, where the output is low-swing.
Figure 22:
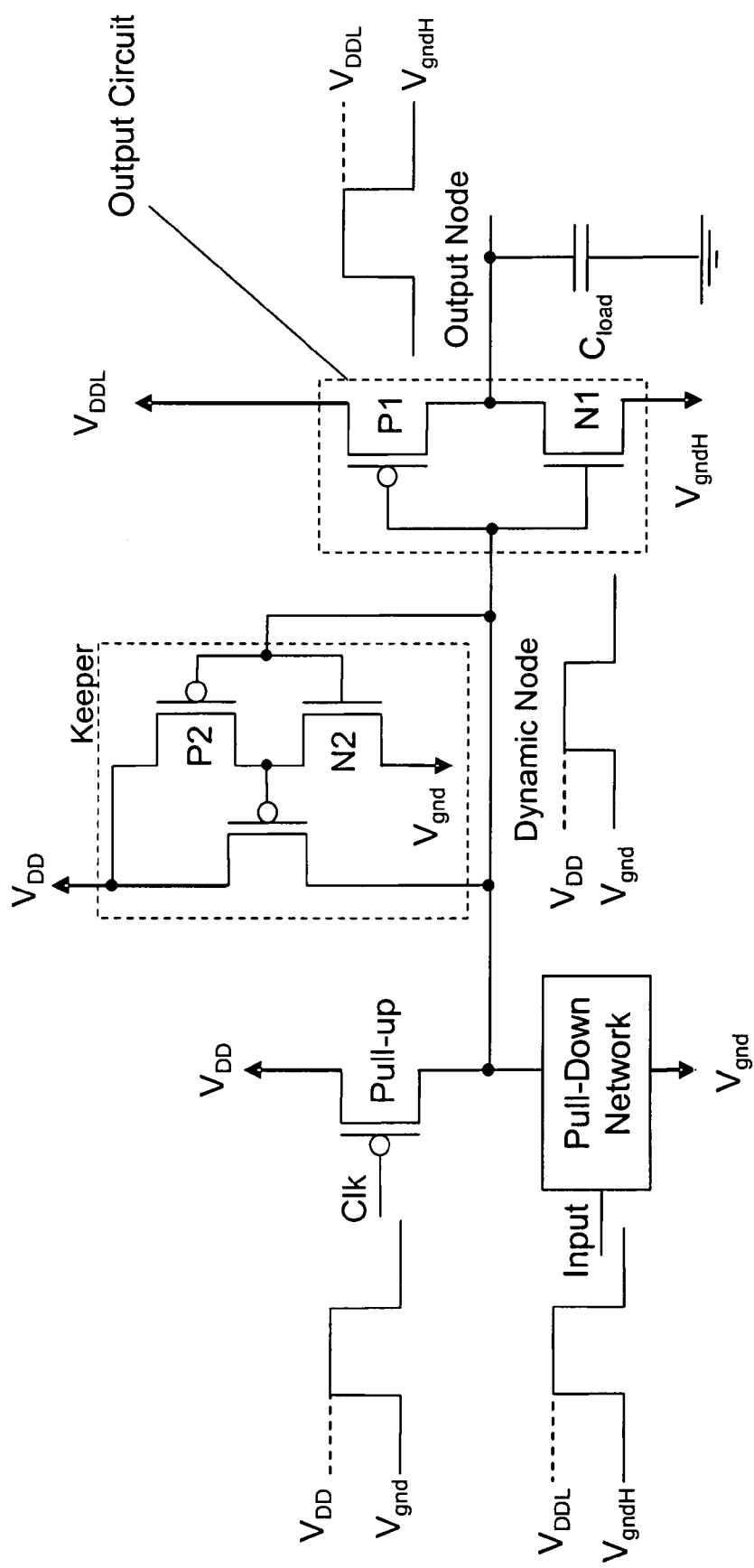
FIG. 22 depicts yet another schematic of a footed output low voltage swing domino logic circuit with dual power supplies, where the output is low-swing.

An output low voltage swing domino circuit based on dual power supplies is also provided. The output low swing domino circuits discussed above may utilize NMOS transistors to reduce the upper boundary of the voltage swing at the output node. Since the voltage swing range may be fixed, the previous circuits may not provide the optimum swing range to minimize the power consumption or PDP. The output low voltage swing circuit based on multiple supply and ground voltages may permit the optimization of the output node voltage swing, thereby minimizing PDP. Meanwhile, full voltage swing signals may be maintained at the dynamic nodes for high speed operation. The voltage swing of the clock signal may also be reduced to lower the dynamic switching power consumption of the clock distribution network. The schematic of an output low voltage swing domino circuit which utilizes an additional power supply ($V_{DDL}$) is shown in FIG. 20. FIG. 20 depicts a schematic of a footless output low voltage swing domino logic circuit with dual power supplies. The keeper in FIG. 20 may be driven with a full-swing signal and $V_{DDL}<V_{DD}$. A second example may utilize an additional ground voltage ($V_{gndH}$), as shown in FIG. 21. FIG. 21 depicts a schematic of a footless output low voltage swing domino logic circuit with dual ground voltages. The keeper in FIG. 21 may be driven with a full-swing signal. $V_{gndH}>V_{gnd}$. A third example utilizes dual power supply and ground voltages as shown in FIG. 22. FIG. 22 depicts a schematic of a footless output low voltage swing domino logic circuit with dual power supply and ground voltages. The keeper in FIG. 22 may be driven with a full-swing signal. $V_{DDL}<V_{DD}$ and $V_{gndH}>V_{gnd}$.

Figure 23:
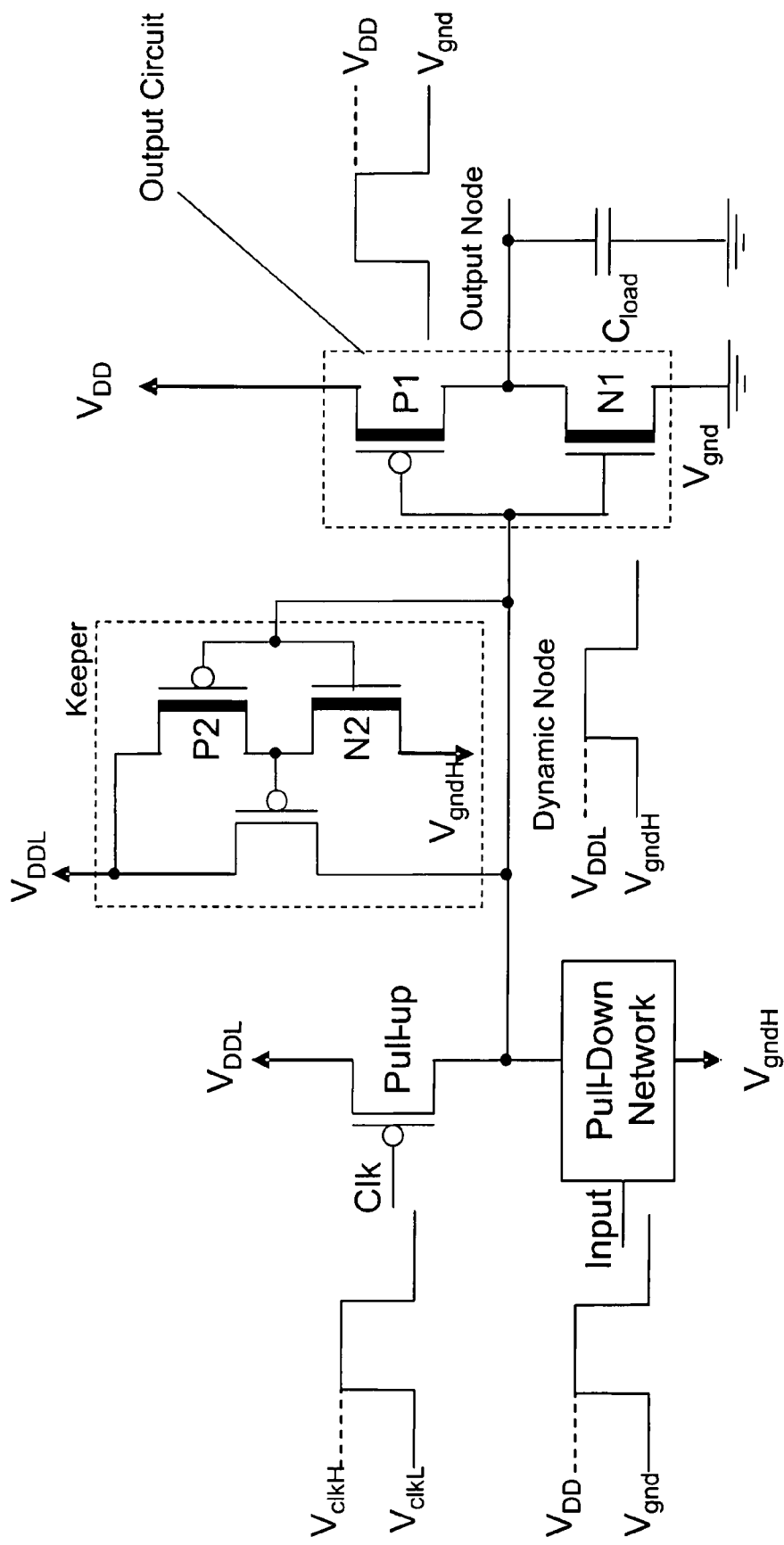
FIG. 23 is a schematic of a bidirectional dynamic node low voltage swing multiple threshold voltage domino circuit with dual power supply and ground voltages.
Figure 24:
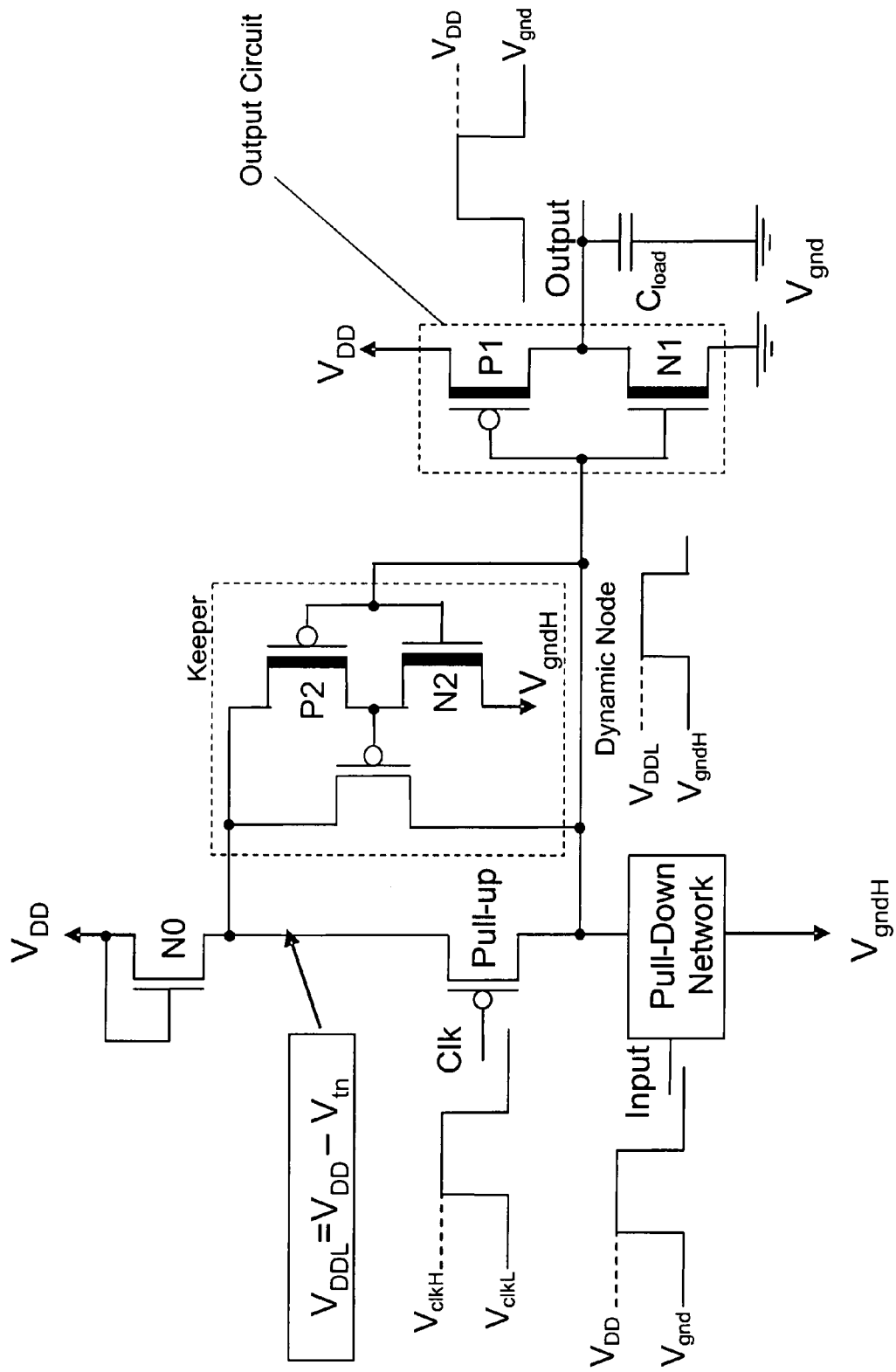
FIG. 24 is another schematic of a bidirectional dynamic node low voltage swing multiple threshold voltage domino circuit with dual power supply and ground voltages.

The low swing circuit may also be implemented in a multiple threshold voltage CMOS technology to lower the leakage power consumption. The transistors in the inverters, the pull-up transistor, and the keeper may have a higher threshold voltage to reduce the leakage power consumption during both the active and idle modes. The schematic of a bidirectional dynamic node low voltage swing multiple threshold voltage domino circuit utilizing dual power supply and ground voltages is shown in FIG. 23. FIG. 23 depicts a schematic of a bidirectional dynamic node low voltage swing multiple threshold voltage domino circuit with dual power supply and ground voltages. Both PMOS and NMOS transistors in the inverters may have a high-$V_t$. $V_{DDL}<V_{DD}$, $V_{gndH}>V_{gnd}$, $V_{clkH}=V_{DD}$ or $V_{DDL}$, $V_{clkL}=V_{gnd}$ or $V_{gndH}$. In the figures, the high-$V_t$ transistors may be represented by a thick line in the channel region. Another example of a schematic of a bidirectional dynamic node low voltage swing multiple threshold voltage domino circuit which utilizes single power supply and dual ground voltages is shown in FIG. 24. Specifically, FIG. 24 depicts a schematic of a bidirectional dynamic node low voltage swing multiple threshold voltage domino circuit with single power supply and dual ground voltages. One or both PMOS and NMOS transistors in the inverters may have a high-$V_t$. $V_{DDL}=V_{DD}-V_{tn}$. $V_{gndH}>V_{gnd}$, $V_{clkH}=V_{DD}$ or $V_{DDL}$, $V_{clkL}=V_{gnd}$ or $V_{gndH}$.

Figure 25:
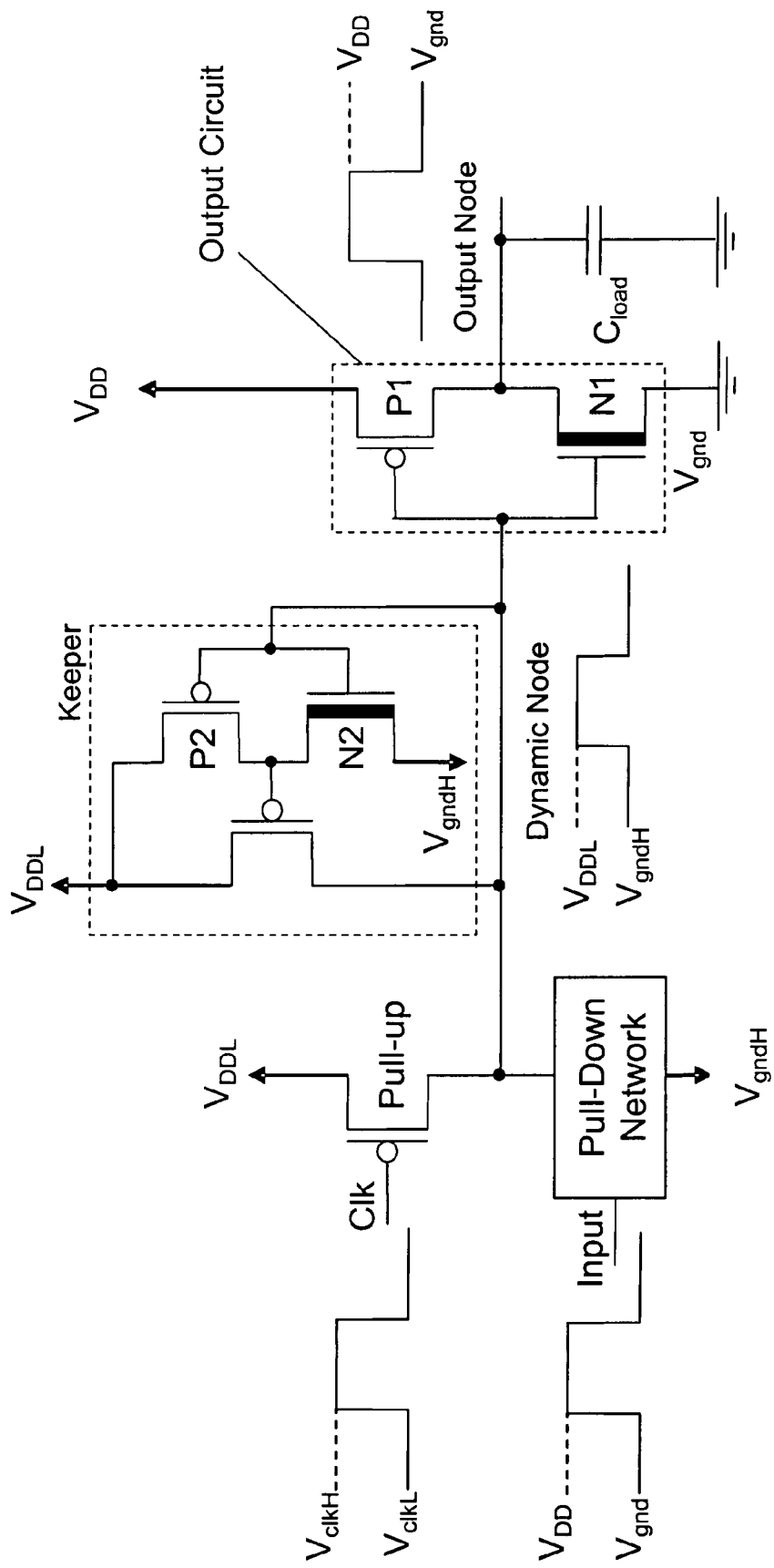
FIG. 25 is yet another schematic of a bidirectional dynamic node low voltage swing multiple threshold voltage domino circuit with dual power supply and ground voltages.
Figure 26:
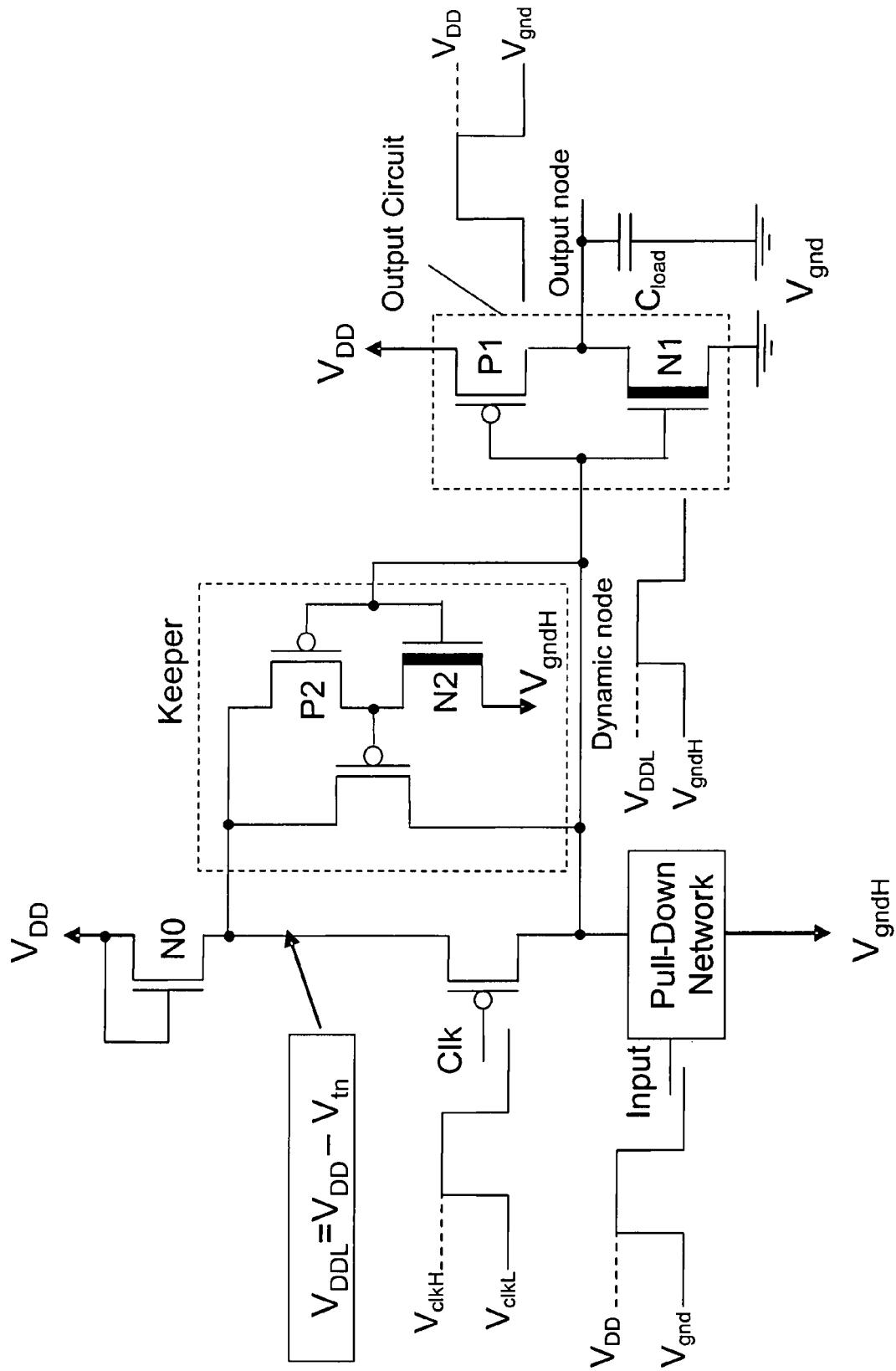
FIG. 26 is a schematic of a bidirectional dynamic node low voltage swing multiple threshold voltage domino circuit with single power supply and dual ground voltages.

In FIGS. 23 and 24, all of the transistors inside the two inverters (P1, P2, N1, and N2) may have a higher threshold voltage (high-$V_t$) to reduce the leakage current. However, a high-$V_t$ P1 may degrade the evaluation speed since P1 may be on the critical evaluation path. Alternatively, a low threshold voltage pull-up transistor may be utilized in the inverters for high speed evaluation. The schematics of bidirectional dynamic node low voltage swing multiple threshold voltage domino circuits with low threshold voltage P1 and P2 are shown in FIGS. 25 and 26. FIG. 25 depicts a schematic of a bidirectional dynamic node low voltage swing multiple threshold voltage domino circuit with dual power supply and ground voltages. The NMOS transistors in the inverters may have a high-$V_t$. $V_{DDL}<V_{DD}$, $V_{gndH}>V_{gnd}$, $V_{clkH}=V_{DD}$ or $V_{DDL}$, $V_{clkL}=V_{gnd}$ or $V_{gndH}$. FIG. 26 depicts a schematic of a bidirectional dynamic node low voltage swing multiple threshold voltage domino circuit with single power supply and dual ground voltages. The NMOS transistors in the inverters may have a high-$V_t$. $V_{DDL}=V_{DD}-V_{tn}$, $V_{gndH}>V_{gnd}$, $V_{clkH}=V_{DD}$ or $V_{DDL}$, $V_{clkL}=V_{gnd}$ or $V_{gndH}$.

Figure 27:
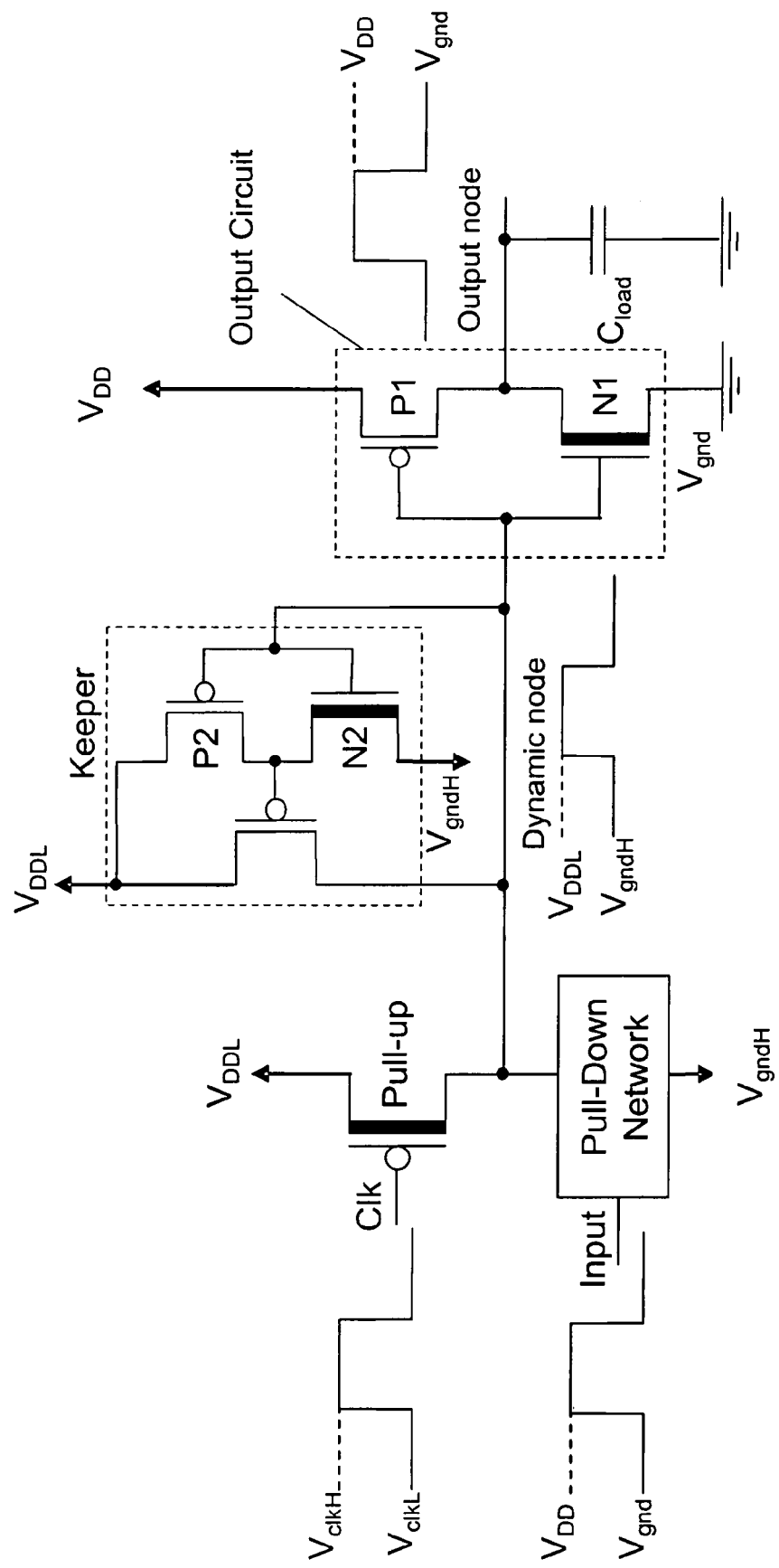
FIG. 27 is a schematic of a bidirectional dynamic node low voltage swing multiple threshold voltage domino circuit with dual power supply and ground voltages.

In FIGS. 23 and 25, the PMOS pull-up transistor may have a low-$V_t$. For a full-swing clock signal, provided that the clock is gated high, the gate-to-source voltage of the pull-up transistor may be positive, thereby, reducing the subthreshold leakage current in the idle mode. Alternatively, for a low-swing clock signal, the low-$V_t$ pull-up transistor may produce significant subthreshold leakage current even if the clock is gated high. In order to further reduce the leakage in the idle mode, the pull-up transistor may have a high-$V_t$ as shown in FIG. 27. Specifically, FIG. 27 depicts a schematic of a bidirectional dynamic node low voltage swing multiple threshold voltage domino circuit with dual power supply and ground voltages. The pull-up transistor and the NMOS transistors in the inverters may have a high-$V_t$. $V_{DDL}<V_{DD}$, $V_{gndH}>V_{gnd}$, $V_{clkH}=V_{DD}$ or $V_{DDL}$, $V_{clkL}=V_{gnd}$ or $V_{gndH}$.

Figure 28:
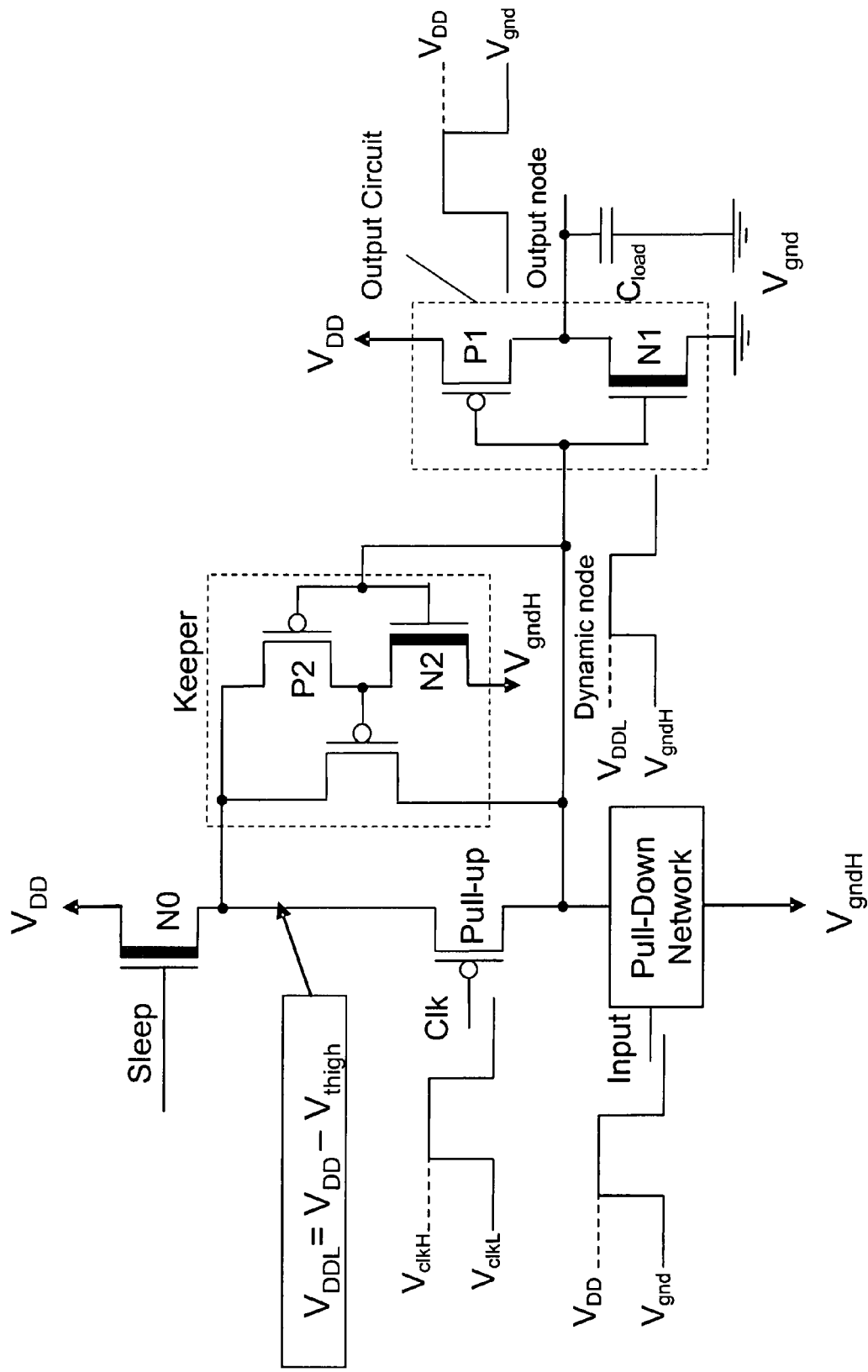
FIG. 28 is a schematic of a bidirectional dynamic node low voltage swing multiple threshold voltage domino circuit with single power supply and dual ground voltages.

In the dual-$V_t$ bidirectional low swing circuits with single power supply, N0 may have a high-$V_t$ in order to further reduce the voltage swing at the dynamic node ($V_{DDL}=V_{DD}-V_{thigh}$, $V_{thigh}$=threshold voltage of a high-$V_t$ NMOS transistor). The active mode power savings may thereby be enhanced. Furthermore, N0 may be driven by a separate sleep signal as shown in FIG. 28. FIG. 28 depicts a schematic of a bidirectional dynamic node low voltage swing multiple threshold voltage domino circuit with single power supply and dual ground voltages. N0 and the NMOS transistors in the inverters may have a high-$V_t$. $V_{DDL}=V_{DD}-V_{thigh}$, $V_{gndH}>V_{gnd}$, $V_{clkH}=V_{DD}$ or $V_{DDL}$, $V_{clkL}=V_{gnd}$ or $V_{gndH}$. In the active mode the sleep signal may be maintained high. Alternatively, in the idle mode, the sleep signal may transition to low. N0 may be cut-off, thereby lowering the subthreshold leakage current.

Figure 29:
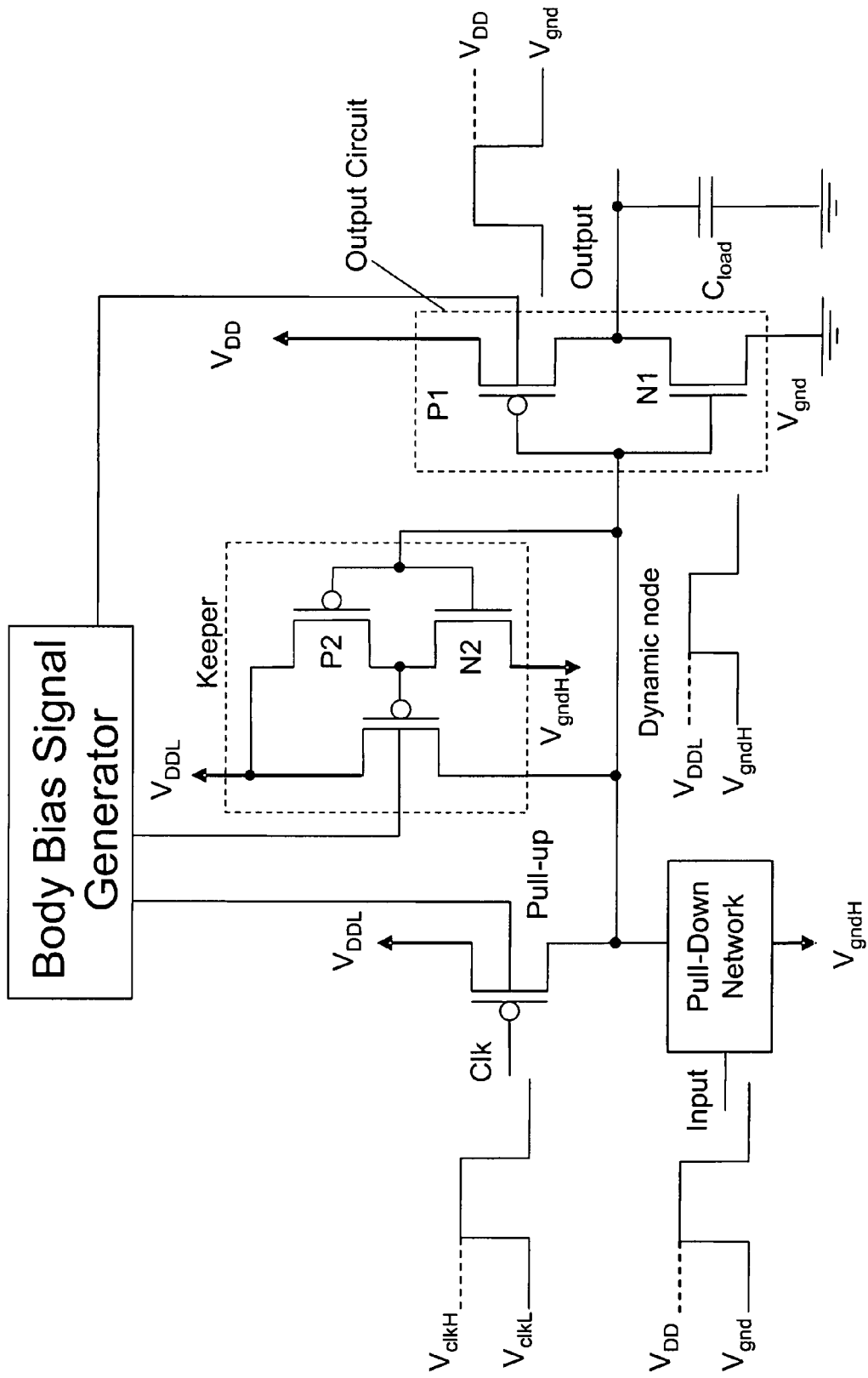
FIG. 29 is a schematic of a body biased bidirectional dynamic node low voltage swing domino circuit with dual power supply and ground voltages.

The low swing circuits may be body biased to increase the speed, enhance the noise immunity, and/or reduce the power consumption. The schematic of a body biased bidirectional dynamic node low voltage swing domino circuit is shown in FIG. 29. FIG. 29 depicts a schematic of a body biased bidirectional dynamic node low voltage swing domino circuit with dual power supply and ground voltages. The body bias signals may be applied to the pull-up transistor, keeper, and the PMOS transistor in the output inverter. $V_{DDL}<V_{DD}$, $V_{gndH}>V_{gnd}$, $V_{clkH}=V_{DD}$ or $V_{DDL}$, $V_{clkL}=V_{gnd}$ or $V_{gndH}$.

The body bias signals in FIG. 29 may be applied to the pull-up transistor, the keeper, and/or the PMOS transistor in the output inverter. The body bias signal generator may generate either a forward body bias signal or a reverse body bias signal depending on the circuit performance requirement. The keeper may be forward body biased to reduce the threshold voltage, thereby enhancing the noise immunity in the active mode. Alternatively, the keeper may be reverse body biased to increase the threshold voltage, thereby reducing the leakage current in the idle mode. Another advantage of reverse body biasing the keeper may be the enhanced evaluation speed since the contention current is reduced in the active mode. The pull-up transistor may be forward body biased for reducing the precharge delay. Alternatively, the pull-up transistor may be reverse body biased for reducing the leakage power consumption. P1 in the output inverter may also be forward body biased to enhance the evaluation speed. Alternatively, P1 may be reverse body biased to reduce the leakage current.

Figure 30:
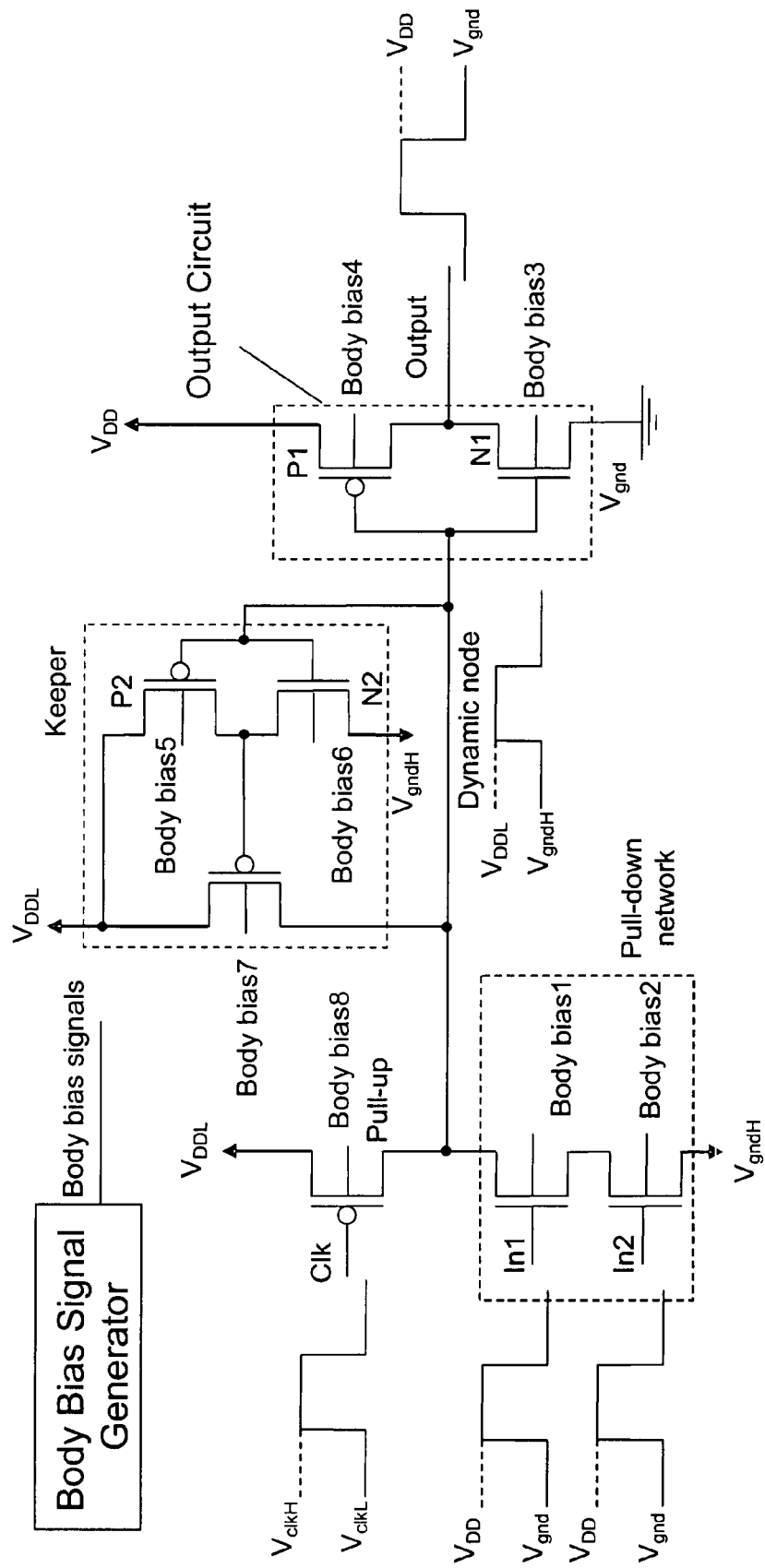
FIG. 30 is a schematic of a body biased bidirectional dynamic node low voltage swing domino circuit with dual power supply and ground voltages.

Similarly, the pull-down network transistors may be forward body biased to enhance the evaluation speed as shown in FIG. 30. FIG. 30 depicts a schematic of a body biased bidirectional dynamic node low voltage swing domino circuit with dual power supply and ground voltages. All of the transistors may be together or may be individually body biased, $V_{DDL}<V_{DD}$, $V_{gndH}>V_{gnd}$, $V_{clkH}=V_{DD}$ or $V_{DDL}$, $V_{clkL}=V_{gnd}$ or $V_{gndH}$. Alternatively, the pull-down network transistors may be reverse body biased to suppress the subthreshold leakage current. The body bias voltages to the transistors in FIG. 30 may be alternated between reverse and forward body bias depending on the different requirements of speed, power, and noise immunity during the active and idle modes of operation.

Figure 31:
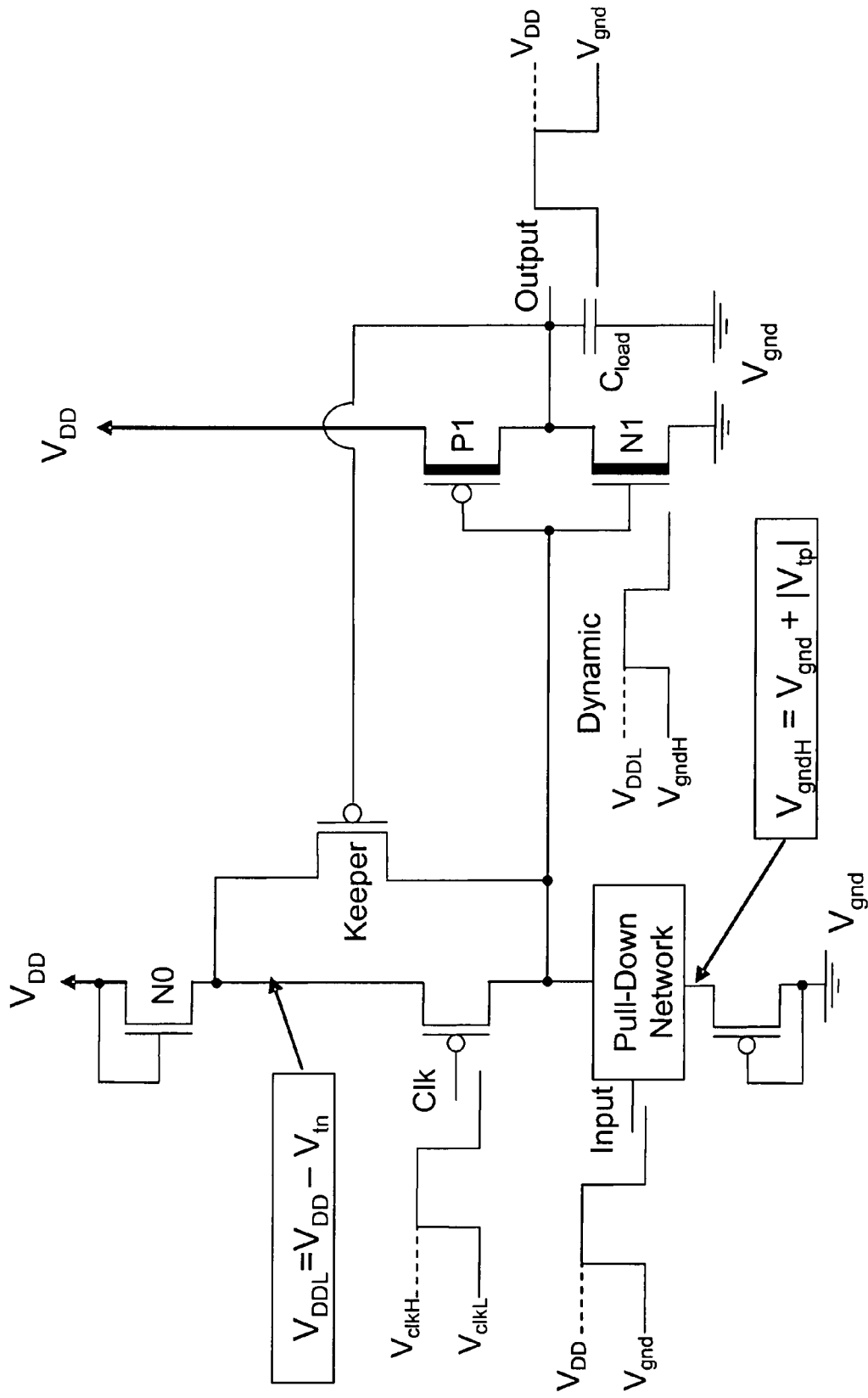
FIG. 31 is a schematic of a dynamic node low voltage swing multiple threshold voltage domino circuit with single power supply and ground voltage.
Figure 32:
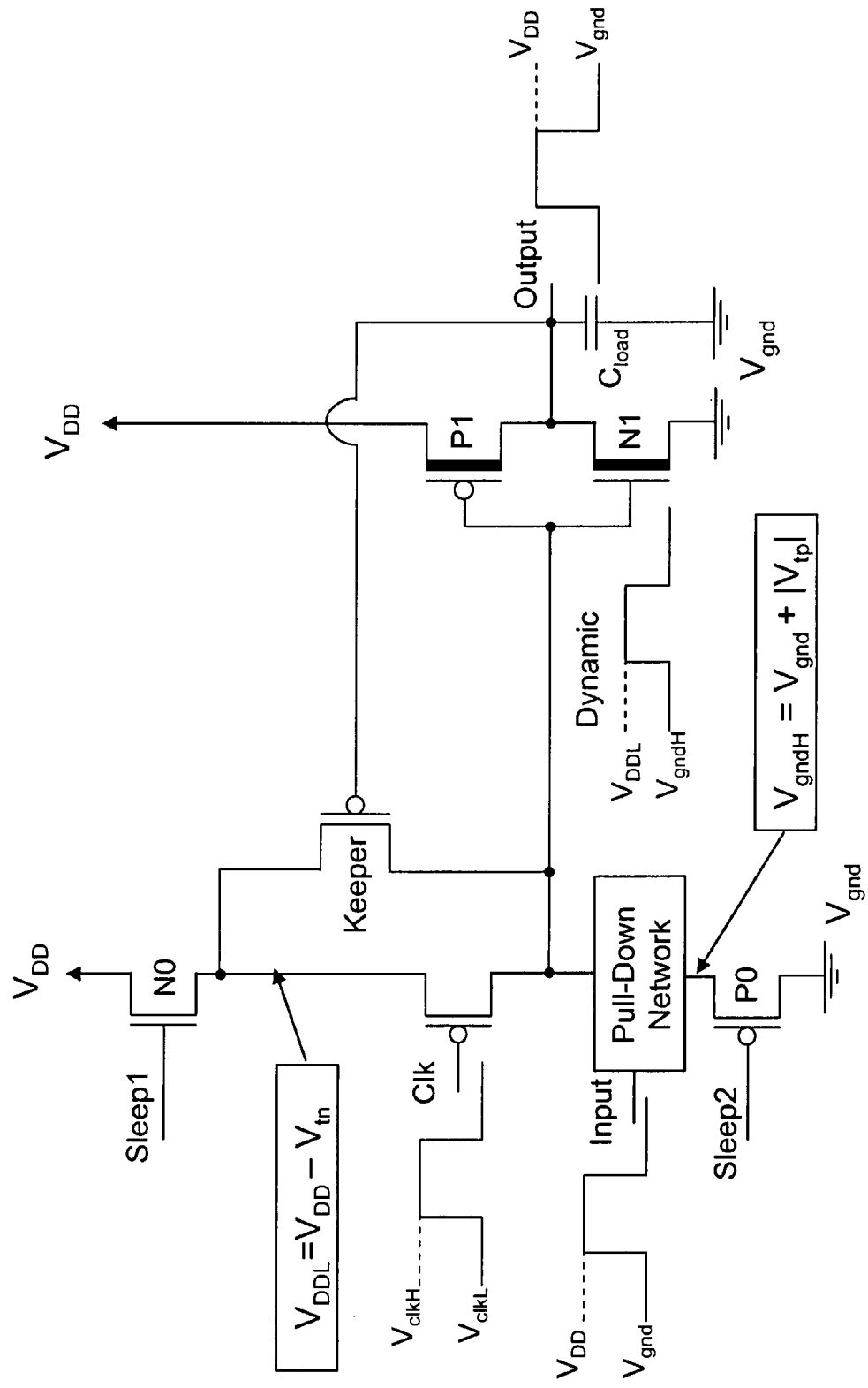
FIG. 32 is a schematic of a dynamic node low voltage swing multiple threshold voltage domino circuit with single power supply and ground voltage.

Another bidirectional dynamic node low voltage swing domino circuit may be based on a multiple threshold voltage CMOS technology, in order to suppress the short-circuit current produced by the output inverter. An example of this is shown in FIG. 31. FIG. 31 depicts a schematic of a dynamic node low voltage swing multiple threshold voltage domino circuit with single power supply and ground voltage. $V_{DDL}=V_{DD}-V_{tn}$. $V_{gndH}=V_{gnd}+|V_{tp}|$. $V_{clkH}=V_{DD}$ or $V_{DDL}$. $V_{clkL}=V_{gnd}$ or $V_{gndH}$. One or both the NMOS and PMOS transistors in the output inverter may have high-$V_t$, thereby reducing the short-circuit current. Sleep signals may be applied to N0 or P0 to further reduce the leakage power consumption in the idle mode as shown in FIG. 32. FIG. 32 depicts a schematic of a dynamic node low voltage swing multiple threshold voltage domino circuit with single power supply and ground voltage. The NMOS and PMOS transistors in the output inverter may have high-$V_t$. N0 and/or P0 may be driven by sleep signals. $V_{DDL}=V_{DD}-V_{tn}$. $V_{gndH}=V_{gnd}+|V_{tp}|$. $V_{clkH}=V_{DD}$ or $V_{DDL}$. $V_{clkL}=V_{gnd}$ or $V_{gndH}$. The Sleep1 signal may be maintained high in the active mode. Sleep1 may transition to low in the idle mode. N0 may be cut-off, thereby lowering the subthreshold leakage current. The Sleep2 signal may be maintained low in the active mode. Sleep2 may transition to high in the idle mode. P0 may be cut-off, thereby lowering the subthreshold leakage current.

Figure 33:
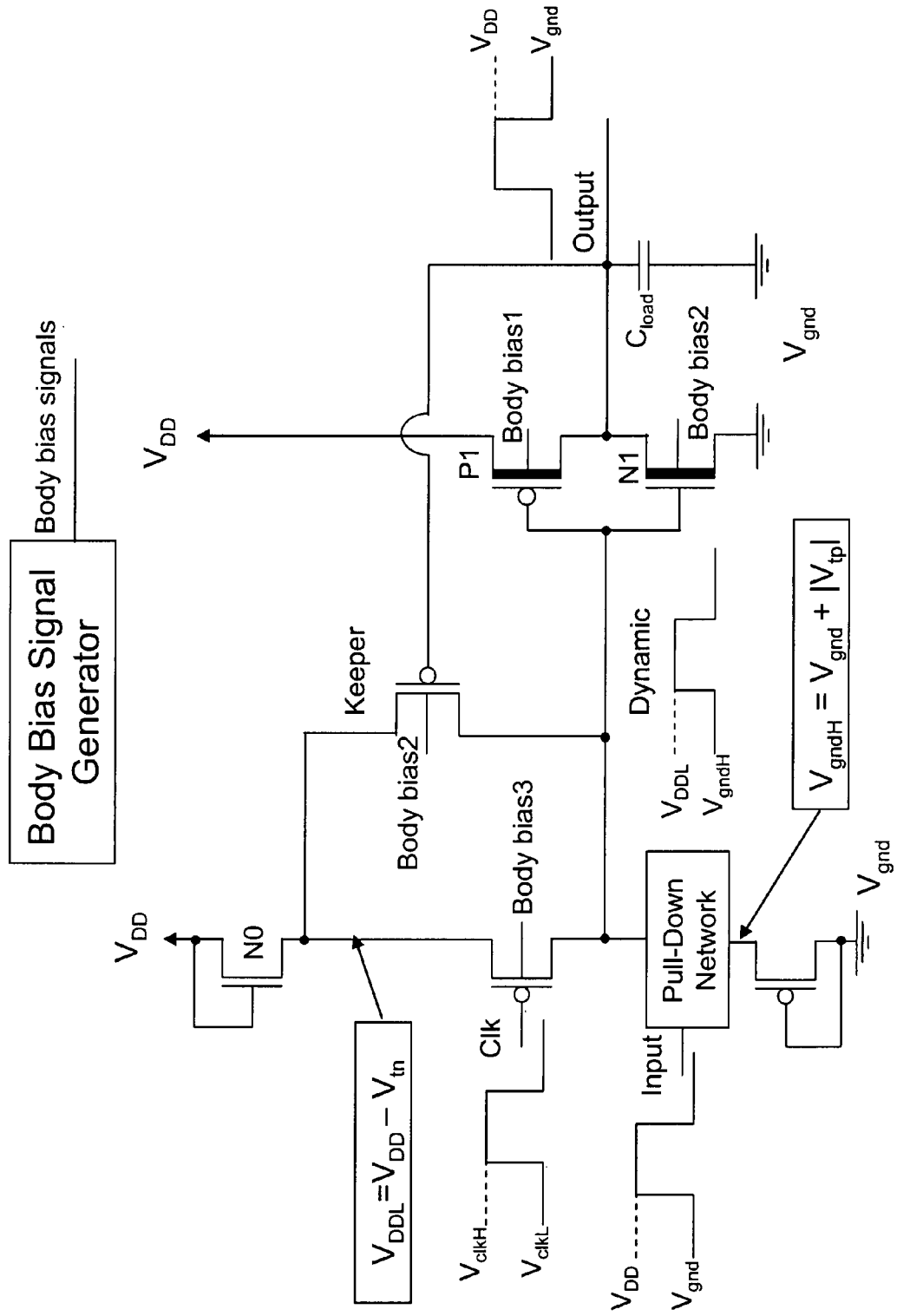
FIG. 33 is a schematic of a body biased low swing multiple threshold voltage domino circuit with single power supply and ground voltage.

The transistors may also either be forward body biased or reverse body biased depending on the performance requirement, as shown in FIG. 33. FIG. 33 depicts a schematic of a body biased low swing multiple threshold voltage domino circuit with single power supply and ground voltage. The NMOS and PMOS transistors in the output inverter may have high-$V_t$. Body bias signals may be applied to P1, the keeper transistor, the pull-up transistor, and/or the other transistors. $V_{DDL}=V_{DD}-V_{tn}$. $V_{gndH}=V_{gnd}+|V_{tp}|$. $V_{clkH}=V_{DD}$ or $V_{DDL}$. $V_{clkL}=V_{gnd}$ or $V_{gndH}$. P1 may be reverse body biased to increase the threshold voltage, thereby further reducing the short-circuit current in the output inverter. Alternatively, P1 may be forward body biased to enhance the evaluation speed. N1 may be reversed body biased to reduce the short-circuit current. Alternatively, N1 may be forward body biased to enhance the precharge speed.

Figure 34:
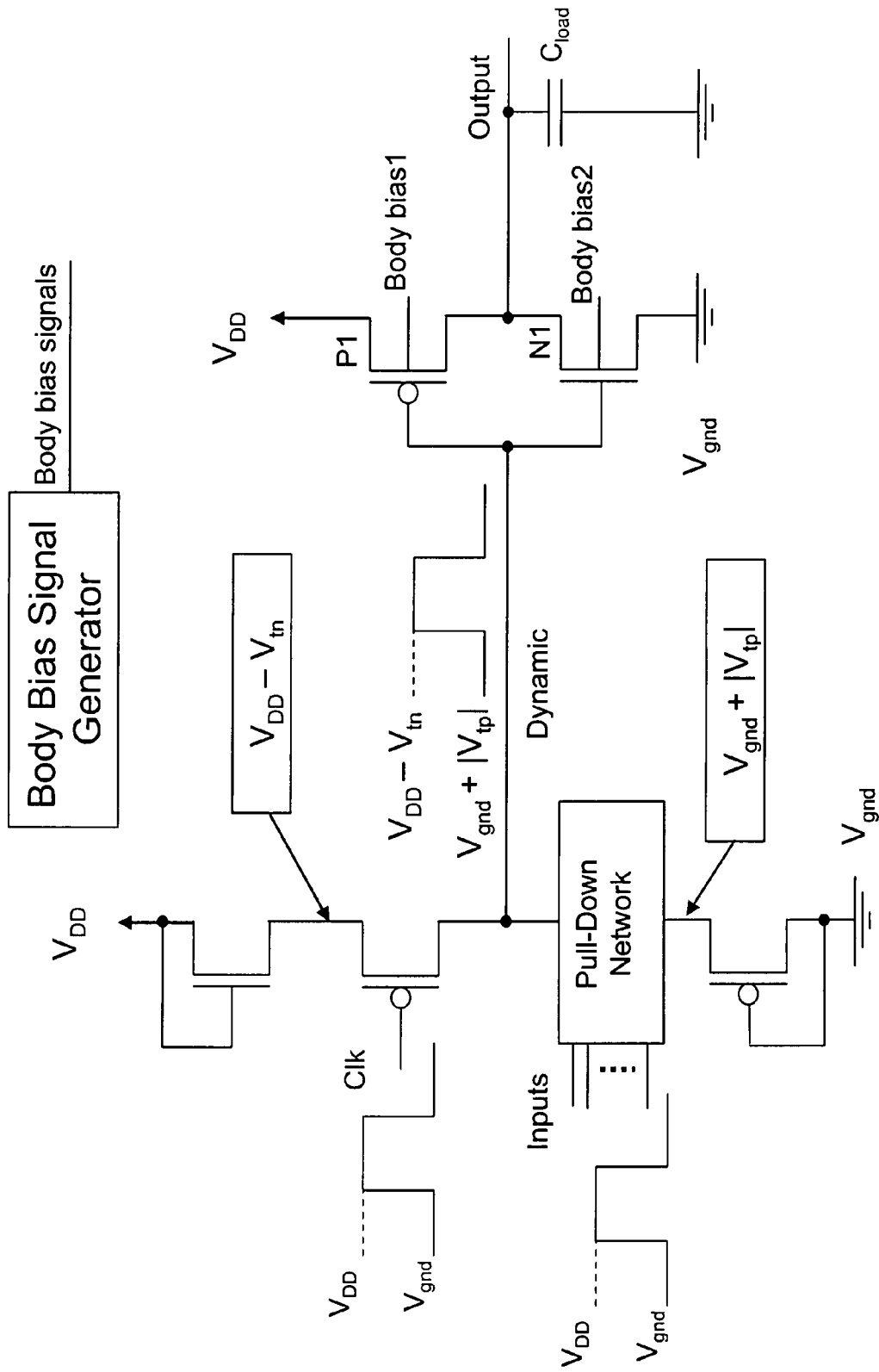
FIG. 34 is a schematic of a body biased low swing domino circuit with single power supply and ground voltage.

If a multiple threshold voltage CMOS technology is not available, the output inverter may be body biased to reduce the short-circuit current. An example of the body biased low swing single threshold voltage domino circuit is shown in FIG. 34. FIG. 34 depicts a schematic of a body biased low swing domino circuit with single power supply and ground voltage. Body bias signals may be dynamically applied to P1 and/or N1. $V_{DDL}=V_{DD}-V_{tn}$. $V_{gndH}=V_{gnd}+|V_{tp}|$. $V_{clkH}=V_{DD}$ or $V_{DDL}$. $V_{clkL}=V_{gnd}$ or $V_{gndH}$. P1 can be reverse body biased to reduce the short-circuit current or forward body biased to enhance the evaluation speed. Alternatively, N1 can be reverse body biased to reduce the short-circuit current or forward body biased to reduce the precharge delay.

It is therefore intended that the foregoing detailed description be regarded as illustrative rather than limiting, and that it be understood that it is the following claims, including all equivalents, that are intended to define the spirit and scope of this invention. Other variations may be readily substituted and combined to achieve particular design goals or accommodate particular materials or manufacturing processes.

We claim:

1. A domino logic circuit comprising:
   a precharge circuit for precharging a dynamic node to a predetermined value;
   an input circuit having at least one input and at least one output, the at least one output in communication with the dynamic node, the input circuit comprising logic for determining a value of the dynamic node based on the at least one input; an output circuit having at least one input and at least one output, the at least one input in communication with the dynamic node; and wherein a voltage swing at the dynamic node is different from a voltage swing at the output for the output circuit, wherein at least one transistor in the precharge circuit or the output circuit has a higher threshold voltage than at least some of the transistors in the input circuit in order to reduce short-circuit current, and wherein the voltage swing at the dynamic node is less than the voltage swing at the output for the output circuit, wherein the voltage swing at the dynamic node comprises a dynamic node high voltage and a dynamic node low voltage, wherein the voltage swing at the output comprises an output node high voltage and an output node low voltage, wherein the dynamic node high voltage is less than the output node high voltage; and wherein the dynamic node low voltage is greater than the output node low voltage.

2. The domino logic circuit of claim 1, wherein the output circuit comprises an inverter; and
   wherein at least one of the transistors in the inverter has a higher threshold voltage.

3. The domino logic circuit of claim 2, wherein only one of the transistors in the inverter has a higher threshold voltage.

4. The domino logic circuit of claim 1, wherein the precharge circuit comprises a pull-up transistor; and
   wherein the pull-up transistor has a higher threshold voltage.

5. The domino logic circuit of claim 1, further comprising a keeper circuit for keeping the dynamic node at the predetermined value after the precharge circuit precharges the dynamic node to the predetermined value; and
   wherein at least one of the transistors in the keeper circuit has a higher threshold than the transistors in the input circuit.

6. The domino logic circuit of claim 5, wherein the keeper circuit comprises a plurality of transistors; and
   wherein fewer than all of the plurality of transistors has a higher threshold than the transistors in the input circuit.

7. The domino logic circuit of claim 1, wherein the at least one transistor is body biased in order to produce the higher threshold voltage.

8. The domino logic circuit of claim 1, wherein the at least one transistor has a different construction than the at least some of the transistors in the input circuit in order to produce the higher threshold voltage in the at least one transistor.

9. A domino logic circuit comprising:
   a precharge circuit for precharging a dynamic node to a predetermined value;
   an input circuit having at least one input and at least one output, the at least one output in communication with the dynamic node, the input circuit comprising logic for determining a value of the dynamic node based on the at least one input; an output circuit having at least one input and at least one output, the at least one input in communication with the dynamic node; and wherein a voltage swing at the dynamic node, with an upper bound of the voltage swing at the dynamic node at most defined by the predetermined value, is greater than a voltage swing at the output for the output circuit, wherein the domino logic circuit comprises at least two ground voltages, the ground voltage to the output circuit being a greater voltage than the ground voltage to the input circuit.

10. The domino logic circuit of claim 9, wherein the domino logic circuit comprises at least two power supplies, the power supply to the output circuit being a lower voltage than the power supply to the precharge circuit.

11. The domino logic circuit of claim 9, wherein the domino logic circuit comprises at least two power supplies, the power supply to the output circuit being a lower voltage than the power supply to the precharge circuit; and
    wherein the domino logic circuit comprises at least two ground voltages, the ground voltage to the output circuit being a greater voltage than the ground voltage to the input circuit.

12. The domino logic circuit of claim 9, further comprising a keeper circuit for keeping the dynamic node at the predetermined value after the precharge circuit precharges the dynamic node to the predetermined value; and
    wherein power for the keeper circuit comprises the power supply to the precharge circuit and ground for the keeper circuit comprises the ground voltage to the input circuit.

13. The domino logic circuit of claim 1, wherein a voltage swing at the dynamic node is less than and asymmetrical to a voltage swing at the output for the output circuit.

14. The domino logic circuit of claim 13, wherein a difference between the output node high voltage and dynamic node high voltage is greater than a difference between the dynamic node low voltage and output node low voltage.

* * * * *